(12) United States Patent
Kim et al.

(10) Patent No.: US 8,994,452 B2
(45) Date of Patent: Mar. 31, 2015

(54) LOW-NOISE HIGH EFFICIENCY BIAS GENERATION CIRCUITS AND METHOD

(75) Inventors: Tae Youn Kim, San Diego, CA (US);
Robert Mark Englekirk, Pacific Palisades, CA (US); Dylan J. Kelly, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 389 days.

(21) Appl. No.: 13/054,781

(22) PCT Filed: Jul. 17, 2009

(86) PCT No.: PCT/US2009/004149
§ 371 (c)(1),
(2), (4) Date: Jan. 18, 2011

(87) PCT Pub. No.: WO2010/008586
PCT Pub. Date: Jan. 21, 2010

(65) Prior Publication Data
US 2011/0156819 A1     Jun. 30, 2011

Related U.S. Application Data

(60) Provisional application No. 61/135,279, filed on Jul. 18, 2008.

(51) Int. Cl.
| | | |
|---|---|---|
| *H03F 3/45* | (2006.01) | |
| *H03F 1/26* | (2006.01) | |
| (Continued) | | |

(52) U.S. Cl.
CPC . *H03F 1/26* (2013.01); *H02M 3/07* (2013.01); *H03F 3/45183* (2013.01);
(Continued)

(58) Field of Classification Search
USPC .................................. 330/252–261
See application file for complete search history.

(56) References Cited

U.S. PATENT DOCUMENTS

| | | |
|---|---|---|
| 3,470,443 A | 9/1969 | Berry et al. |
| 3,646,361 A | 2/1972 | Pfiffner |

(Continued)

FOREIGN PATENT DOCUMENTS

| | | |
|---|---|---|
| DE | 102005039138 | 2/2007 |
| EP | 385641 | 9/1990 |

(Continued)

OTHER PUBLICATIONS

Young, Lee W., International Search Report and Written Opinion received from USRO dated Mar. 14, 2011 for related appln. No. PCT/US2009/004149, 25 pages.

(Continued)

*Primary Examiner* — Hieu Nguyen
(74) *Attorney, Agent, or Firm* — Jaquez Land Richman LLP; Martin J. Jaquez, Esq.

(57) ABSTRACT

A bias generation method or apparatus defined by any one or any practical combination of numerous features that contribute to low noise and/or high efficiency biasing, including: having a charge pump control clock output with a waveform having limited harmonic content or distortion compared to a sine wave; having a ring oscillator to generating a charge pump clock that includes inverters current limited by cascode devices and achieves substantially rail-to-rail output amplitude; having a differential ring oscillator with optional startup and/or phase locking features to produce two phase outputs suitably matched and in adequate phase opposition; having a ring oscillator of less than five stages generating a charge pump clock; capacitively coupling the clock output(s) to some or all of the charge transfer capacitor switches; biasing an FET, which is capacitively coupled to a drive signal, to a bias voltage via an "active bias resistor" circuit that conducts between output terminals only during portions of a waveform appearing between the terminals, and/or wherein the bias voltage is generated by switching a small capacitance at cycles of said waveform. A charge pump for the bias generation may include a regulating feedback loop including an OTA that is also suitable for other uses, the OTA having a ratio-control input that controls a current mirror ratio in a differential amplifier over a continuous range, and optionally has differential outputs including an inverting output produced by a second differential amplifier that optionally includes a variable ratio current mirror controlled by the same ratio-control input. The ratio-control input may therefore control a common mode voltage of the differential outputs of the OTA. A control loop around the OTA may be configured to control the ratio of one or more variable ratio current mirrors, which may particularly control the output common mode voltage, and may control it such that the inverting output level tracks the non-inverting output level to cause the amplifier to function as a high-gain integrator.

12 Claims, 7 Drawing Sheets

(51) Int. Cl.
*H02M 3/07* (2006.01)
*H03K 17/14* (2006.01)
*H03H 11/24* (2006.01)

(52) U.S. Cl.
CPC ....... *H03F 3/45237* (2013.01); *H03F 3/45475* (2013.01); *H03F 3/45659* (2013.01); *H03K 17/145* (2013.01); *H03H 11/245* (2013.01); *H03F 2200/453* (2013.01); *H03F 2200/456* (2013.01); *H03F 2200/474* (2013.01); *H03F 2203/45138* (2013.01); *H03F 2203/45188* (2013.01); *H03F 2203/45366* (2013.01); *H03F 2203/45418* (2013.01); *H03F 2203/45424* (2013.01); *H03F 2203/45471* (2013.01); *H03F 2203/45642* (2013.01)
USPC ............................ 330/257; 330/261; 330/296

(56) References Cited

U.S. PATENT DOCUMENTS

| | | |
|---|---|---|
| 3,731,112 A | 5/1973 | Smith |
| 3,878,450 A | 4/1975 | Greatbatch |
| 3,942,047 A | 3/1976 | Buchanan |
| 3,943,428 A | 3/1976 | Whidden |
| 3,955,353 A | 5/1976 | Astle |
| 3,975,671 A | 8/1976 | Stoll |
| 3,995,228 A | 11/1976 | Pass et al. |
| 4,047,091 A | 9/1977 | Hutchines et al. |
| 4,061,929 A | 12/1977 | Asano |
| 4,068,295 A | 1/1978 | Portmann |
| 4,106,086 A | 8/1978 | Holbrook et al. |
| 4,158,182 A | 6/1979 | Washburn |
| 4,186,436 A | 1/1980 | Ishiwatari |
| 4,316,101 A | 2/1982 | Minner |
| 4,321,661 A | 3/1982 | Sano |
| 4,344,050 A | 8/1982 | Callahan |
| 4,374,357 A | 2/1983 | Olesin et al. |
| 4,388,537 A | 6/1983 | Kanuma |
| 4,390,798 A | 6/1983 | Kurafuji |
| 4,460,952 A | 7/1984 | Risinger |
| RE31,749 E | 11/1984 | Yamashiro |
| 4,485,433 A | 11/1984 | Topich |
| 4,575,644 A | 3/1986 | Leslie |
| 4,621,315 A | 11/1986 | Vaughn et al. |
| 4,633,106 A | 12/1986 | Backes et al. |
| 4,638,184 A | 1/1987 | Kimura |
| 4,679,134 A | 7/1987 | Bingham |
| 4,703,196 A | 10/1987 | Arakawa |
| 4,736,169 A | 4/1988 | Weaver et al. |
| 4,739,191 A | 4/1988 | Puar |
| 4,746,960 A | 5/1988 | Valeri et al. |
| 4,752,699 A | 6/1988 | Cranford, Jr. et al. |
| 4,769,784 A | 9/1988 | Doluca et al. |
| 4,777,577 A | 10/1988 | Bingham et al. |
| 4,839,787 A | 6/1989 | Kojima et al. |
| 4,847,519 A | 7/1989 | Wahl et al. |
| 4,891,609 A | 1/1990 | Eilley |
| 4,897,774 A | 1/1990 | Bingham et al. |
| 5,023,465 A | 6/1991 | Douglas et al. |
| 5,023,494 A | 6/1991 | Tsukii et al. |
| 5,029,282 A | 7/1991 | Ito |
| 5,032,799 A | 7/1991 | Milberger et al. |
| 5,038,325 A | 8/1991 | Douglas et al. |
| 5,061,907 A | 10/1991 | Rasmussen |
| 5,068,626 A | 11/1991 | Takagi et al. |
| 5,075,572 A | 12/1991 | Poteet et al. |
| 5,081,371 A | 1/1992 | Wong |
| 5,111,375 A | 5/1992 | Marshall |
| 5,124,571 A | 6/1992 | Gillingham et al. |
| 5,126,590 A | 6/1992 | Chern |
| 5,138,190 A | 8/1992 | Yamazaki et al. |
| 5,146,178 A | 9/1992 | Nojima et al. |
| 5,180,928 A | 1/1993 | Choi |
| 5,182,529 A | 1/1993 | Chern |
| 5,193,198 A | 3/1993 | Yokouchi |
| 5,196,996 A | 3/1993 | Oh |
| 5,208,557 A | 5/1993 | Kersh |
| 5,212,456 A | 5/1993 | Kovalcik et al. |
| 5,216,588 A | 6/1993 | Bajwa et al. |
| 5,274,343 A | 12/1993 | Russell et al. |
| 5,289,137 A | 2/1994 | Nodar et al. |
| 5,306,954 A | 4/1994 | Chan et al. |
| 5,317,181 A | 5/1994 | Tyson |
| 5,392,186 A | 2/1995 | Alexander et al. |
| 5,392,205 A | 2/1995 | Zavaleta |
| 5,394,372 A | 2/1995 | Tanaka et al. |
| 5,408,140 A | 4/1995 | Kawai et al. |
| 5,418,499 A | 5/1995 | Nakao |
| 5,422,586 A | 6/1995 | Tedrow et al. |
| 5,446,418 A | 8/1995 | Hara |
| 5,455,794 A | 10/1995 | Javanifard et al. |
| 5,465,061 A | 11/1995 | Dufour |
| 5,483,195 A | 1/1996 | Brown |
| 5,493,249 A | 2/1996 | Manning |
| 5,519,360 A | 5/1996 | Keeth |
| 5,528,245 A | 6/1996 | Aker et al. |
| 5,535,160 A | 7/1996 | Yamaguchi |
| 5,553,021 A | 9/1996 | Kubono et al. |
| 5,554,892 A | 9/1996 | Norimatsu |
| 5,589,793 A | 12/1996 | Kassapian |
| 5,600,281 A | 2/1997 | Mori et al. |
| 5,670,907 A | 9/1997 | Gorecki et al. |
| 5,672,992 A | 9/1997 | Nadd |
| 5,677,649 A | 10/1997 | Martin |
| 5,677,650 A | 10/1997 | Kwasniewski et al. |
| 5,689,213 A | 11/1997 | Sher |
| 5,694,308 A | 12/1997 | Cave |
| 5,698,877 A | 12/1997 | Gonzalez |
| 5,729,039 A | 3/1998 | Beyer et al. |
| 5,734,291 A | 3/1998 | Tasdighi et al. |
| 5,757,170 A | 5/1998 | Pinney |
| 5,786,617 A | 7/1998 | Merrill et al. |
| 5,793,246 A | 8/1998 | Vest et al. |
| 5,808,505 A | 9/1998 | Tsukada |
| 5,812,939 A | 9/1998 | Kohama |
| 5,818,289 A | 10/1998 | Chevallier et al. |
| 5,818,766 A | 10/1998 | Song |
| 5,864,328 A | 1/1999 | Kajimoto |
| 5,874,849 A | 2/1999 | Marotta et al. |
| 5,878,331 A | 3/1999 | Yamamoto et al. |
| 5,889,428 A | 3/1999 | Young |
| 5,892,400 A | 4/1999 | van Saders et al. |
| 5,917,362 A | 6/1999 | Kohama |
| 5,945,867 A | 8/1999 | Uda et al. |
| 5,959,335 A | 9/1999 | Bryant et al. |
| 5,969,988 A | 10/1999 | Tanzawa et al. |
| 6,020,781 A | 2/2000 | Fujioka |
| 6,064,275 A | 5/2000 | Yamauchi |
| 6,064,872 A | 5/2000 | Vice |
| 6,081,165 A | 6/2000 | Goldman |
| 6,087,968 A | 7/2000 | Roza |
| 6,094,103 A | 7/2000 | Jeong et al. |
| 6,107,885 A | 8/2000 | Miguelez et al. |
| 6,122,185 A | 9/2000 | Utsunomiya |
| 6,130,572 A | 10/2000 | Ghilardelli et al. |
| 6,169,444 B1 | 1/2001 | Thurber |
| 6,188,590 B1 | 2/2001 | Chang et al. |
| 6,195,307 B1 | 2/2001 | Umezawa et al. |
| RE37,124 E | 4/2001 | Monk et al. |
| 6,226,206 B1 | 5/2001 | Maeda |
| 6,249,446 B1 | 6/2001 | Shearon et al. |
| 6,297,687 B1 | 10/2001 | Sugimura |
| 6,308,047 B1 | 10/2001 | Yamamoto et al. |
| 6,337,594 B1 | 1/2002 | Hwang |
| 6,339,349 B1 | 1/2002 | Rajagopalan |
| 6,356,062 B1 | 3/2002 | Elmhurst et al. |
| 6,400,211 B1 | 6/2002 | Yokomizo et al. |
| 6,411,531 B1 | 6/2002 | Nork et al. |
| 6,414,863 B1 | 7/2002 | Bayer et al. |
| 6,424,585 B1 | 7/2002 | Ooishi |
| 6,429,632 B1 | 8/2002 | Forbes et al. |
| 6,429,723 B1 | 8/2002 | Hastings |
| 6,429,730 B2 | 8/2002 | Houghton et al. |

(56) References Cited

U.S. PATENT DOCUMENTS

| | | |
|---|---|---|
| 6,429,732 B1 | 8/2002 | Tedrow et al. |
| 6,452,232 B1 | 9/2002 | Adan |
| 6,486,728 B2 | 11/2002 | Kleveland |
| 6,486,729 B2 | 11/2002 | Imamiya |
| 6,496,074 B1 | 12/2002 | Sowlati |
| 6,504,213 B1 | 1/2003 | Ebina |
| 6,518,829 B2 | 2/2003 | Butler |
| 6,535,071 B2 | 3/2003 | Forbes |
| 6,537,861 B1 | 3/2003 | Kroell et al. |
| 6,559,689 B1 | 5/2003 | Clark |
| 6,563,366 B1 | 5/2003 | Kohama |
| 6,617,933 B2 | 9/2003 | Ito et al. |
| 6,653,697 B2 | 11/2003 | Hidaka et al. |
| 6,661,682 B2 | 12/2003 | Kim et al. |
| 6,677,641 B2 | 1/2004 | Kocon |
| 6,714,065 B2 | 3/2004 | Komiya et al. |
| 6,717,458 B1 | 4/2004 | Potanin |
| 6,737,926 B2 | 5/2004 | Forbes |
| 6,744,224 B2 | 6/2004 | Ishii |
| 6,784,737 B2 * | 8/2004 | Martin et al. .................. 330/257 |
| 6,788,130 B2 | 9/2004 | Pauletti et al. |
| 6,788,578 B1 | 9/2004 | Tang |
| 6,794,927 B2 | 9/2004 | Bedarida et al. |
| 6,801,076 B1 | 10/2004 | Merritt |
| 6,803,807 B2 | 10/2004 | Fujiyama et al. |
| 6,806,761 B1 | 10/2004 | Aude |
| 6,809,603 B1 | 10/2004 | Ho |
| 6,812,775 B2 | 11/2004 | Seo |
| 6,816,000 B2 | 11/2004 | Miyamitsu |
| 6,816,001 B2 | 11/2004 | Khouri et al. |
| 6,816,016 B2 | 11/2004 | Sander et al. |
| 6,819,187 B1 | 11/2004 | Ming et al. |
| 6,819,938 B2 | 11/2004 | Sahota |
| 6,825,699 B2 | 11/2004 | Marshall et al. |
| 6,825,730 B1 | 11/2004 | Sun |
| 6,828,614 B2 | 12/2004 | Gonzalez |
| 6,831,499 B2 | 12/2004 | Oddone et al. |
| 6,831,847 B2 | 12/2004 | Perry |
| 6,833,745 B2 | 12/2004 | Hausmann et al. |
| 6,833,752 B2 | 12/2004 | Merritt et al. |
| 6,836,173 B1 | 12/2004 | Yang |
| 6,836,176 B2 | 12/2004 | Zeng et al. |
| 6,844,762 B2 | 1/2005 | Sanchez |
| 6,847,251 B2 | 1/2005 | Kao et al. |
| 6,853,566 B2 | 2/2005 | Itoh |
| 6,855,655 B2 | 2/2005 | Wagner et al. |
| 6,856,177 B1 | 2/2005 | de Frutos et al. |
| 6,871,059 B1 | 3/2005 | Piro et al. |
| 6,879,502 B2 | 4/2005 | Yoshida et al. |
| 6,891,234 B1 | 5/2005 | Connelly et al. |
| 6,906,575 B2 | 6/2005 | Tanaka |
| 6,947,720 B2 | 9/2005 | Razavi et al. |
| 6,954,623 B2 | 10/2005 | Chang et al. |
| 6,967,523 B2 | 11/2005 | DeMone |
| 7,023,260 B2 | 4/2006 | Thorp et al. |
| 7,042,245 B2 | 5/2006 | Hidaka |
| 7,109,532 B1 | 9/2006 | Lee et al. |
| 7,123,898 B2 | 10/2006 | Burgener et al. |
| 7,129,796 B2 | 10/2006 | Goto |
| 7,161,197 B2 | 1/2007 | Nakatsuka et al. |
| 7,180,794 B2 | 2/2007 | Matsue |
| 7,202,712 B2 | 4/2007 | Athas |
| 7,212,788 B2 | 5/2007 | Weber et al. |
| 7,355,455 B2 | 4/2008 | Hidaka |
| 7,359,677 B2 | 4/2008 | Huang et al. |
| 7,391,282 B2 | 6/2008 | Nakatsuka et al. |
| 7,430,133 B1 | 9/2008 | McIntyre et al. |
| 7,457,594 B2 | 11/2008 | Theobold et al. |
| 7,460,852 B2 | 12/2008 | Burgener et al. |
| 7,486,128 B2 | 2/2009 | Yen et al. |
| 7,515,882 B2 | 4/2009 | Kelcourse et al. |
| 7,546,089 B2 | 6/2009 | Bellantoni |
| 7,551,036 B2 | 6/2009 | Berroth et al. |
| 7,560,977 B2 | 7/2009 | Miyazaki et al. |
| 7,659,152 B2 | 2/2010 | Gonzalez et al. |
| 7,667,529 B2 | 2/2010 | Consuelo et al. |
| 7,719,343 B2 | 5/2010 | Burgener et al. |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,756,494 B2 | 7/2010 | Fujioka et al. |
| 7,786,807 B1 | 8/2010 | Li et al. |
| 7,796,969 B2 | 9/2010 | Kelly et al. |
| 7,817,966 B2 | 10/2010 | Prikhodko et al. |
| 7,860,499 B2 | 12/2010 | Burgener et al. |
| 7,868,683 B2 | 1/2011 | Ilkov |
| 7,910,993 B2 | 3/2011 | Brindle et al. |
| 7,928,759 B2 | 4/2011 | Hidaka |
| 7,936,213 B2 | 5/2011 | Shin et al. |
| 7,944,277 B1 | 5/2011 | Sinitsky et al. |
| 7,956,675 B2 | 6/2011 | Saitoh et al. |
| 7,969,235 B2 | 6/2011 | Pan |
| 7,982,265 B2 | 7/2011 | Challa et al. |
| 8,072,258 B2 | 12/2011 | Yamahira |
| 8,103,226 B2 | 1/2012 | Andrys et al. |
| 8,131,251 B2 | 3/2012 | Burgener et al. |
| 8,195,103 B2 | 6/2012 | Waheed et al. |
| 8,253,494 B2 | 8/2012 | Blednov |
| 8,378,736 B2 | 2/2013 | Burgener et al. |
| 8,559,907 B2 | 10/2013 | Burgener et al. |
| 8,649,754 B2 | 2/2014 | Burgener et al. |
| 8,674,749 B2 | 3/2014 | Tran et al. |
| 8,686,787 B2 | 4/2014 | Swonger |
| 8,816,659 B2 | 8/2014 | Kim et al. |
| 2001/0031518 A1 | 10/2001 | Kim et al. |
| 2002/0115244 A1 | 8/2002 | Park et al. |
| 2002/0140412 A1 | 10/2002 | Maneatis |
| 2002/0153940 A1 | 10/2002 | Wurcer et al. |
| 2003/0002452 A1 | 1/2003 | Sahota |
| 2003/0034849 A1 | 2/2003 | Sanduleanu |
| 2003/0141543 A1 | 7/2003 | Bryant et al. |
| 2003/0201494 A1 | 10/2003 | Maeda et al. |
| 2004/0061130 A1 | 4/2004 | Morizuka |
| 2004/0080364 A1 | 4/2004 | Sander et al. |
| 2004/0129975 A1 | 7/2004 | Koh et al. |
| 2004/0204013 A1 | 10/2004 | Ma et al. |
| 2005/0052220 A1 | 3/2005 | Burgener et al. |
| 2005/0077564 A1 | 4/2005 | Forbes |
| 2005/0121699 A1 | 6/2005 | Chen et al. |
| 2006/0194558 A1 | 8/2006 | Kelly |
| 2006/0281418 A1 | 12/2006 | Huang et al. |
| 2006/0284670 A1 | 12/2006 | Eid et al. |
| 2007/0045697 A1 | 3/2007 | Cheng et al. |
| 2007/0069801 A1 | 3/2007 | Ragone et al. |
| 2007/0146064 A1 | 6/2007 | Morie et al. |
| 2007/0279120 A1 | 12/2007 | Brederlow et al. |
| 2008/0007980 A1 | 1/2008 | Fujiwara |
| 2008/0030237 A1 | 2/2008 | Danioni et al. |
| 2008/0044041 A1 | 2/2008 | Tucker et al. |
| 2008/0076371 A1 | 3/2008 | Dribinsky et al. |
| 2008/0116979 A1 | 5/2008 | Lesso et al. |
| 2008/0272833 A1 | 11/2008 | Ivanov et al. |
| 2008/0272845 A1 | 11/2008 | Willassen et al. |
| 2008/0298605 A1 | 12/2008 | Fan et al. |
| 2009/0066407 A1 | 3/2009 | Bowman et al. |
| 2010/0033226 A1 | 2/2010 | Kim et al. |
| 2010/0052771 A1 | 3/2010 | Hartono |
| 2010/0214010 A1 | 8/2010 | Burgener et al. |
| 2010/0245327 A1 | 9/2010 | Tsujino et al. |
| 2011/0156819 A1 | 6/2011 | Kim et al. |
| 2011/0163779 A1 | 7/2011 | Hidaka |
| 2011/0299437 A1 | 12/2011 | Mikhemar et al. |
| 2012/0007679 A1 | 1/2012 | Burgener et al. |
| 2012/0038344 A1 | 2/2012 | Kim |
| 2012/0242379 A1 | 9/2012 | Obkircher et al. |
| 2012/0286854 A1 | 11/2012 | Swonger |
| 2013/0229841 A1 | 9/2013 | Giuliano |
| 2014/0055194 A1 | 2/2014 | Burgener et al. |
| 2014/0085006 A1 | 3/2014 | Mostov et al. |
| 2014/0087673 A1 | 3/2014 | Mostov et al. |

(56) References Cited

U.S. PATENT DOCUMENTS

| | | | |
|---|---|---|---|
| 2015/0002195 | A1 | 1/2015 | Englekirk |
| 2015/0002214 | A1 | 1/2015 | Englekirk |

FOREIGN PATENT DOCUMENTS

| | | |
|---|---|---|
| EP | 0622901 | 11/1994 |
| EP | A-0 938 094 | 8/1999 |
| EP | 2421132 | 2/2012 |
| EP | 2421132 A2 | 2/2012 |
| EP | 1664966 | 7/2014 |
| GB | 2451524 | 2/2009 |
| JP | 55-75348 | 6/1980 |
| JP | 01-254014 | 11/1989 |
| JP | 04-34980 | 2/1992 |
| JP | 04-334105 | 11/1992 |
| JP | 05-111241 | 4/1993 |
| JP | 06-152334 | 5/1994 |
| JP | 06-314985 | 11/1994 |
| JP | 06-334506 | 12/1994 |
| JP | 08-148949 | 6/1996 |
| JP | 08-307305 | 11/1996 |
| JP | 09-161472 | 6/1997 |
| JP | 09-200021 | 7/1997 |
| JP | 10-93471 | 4/1998 |
| JP | 10-242477 | 9/1998 |
| JP | 10-242829 | 9/1998 |
| JP | 11-136111 | 5/1999 |
| JP | 11-252900 | 9/1999 |
| JP | 2000166220 | 6/2000 |
| JP | 2001-051758 | 2/2001 |
| JP | 2001-119281 | 4/2001 |
| JP | 2001-119927 | 4/2001 |
| JP | 2002-119053 | 4/2002 |
| JP | 2003-060451 | 2/2003 |
| JP | 03-198248 | 7/2003 |
| JP | 2004-147175 | 5/2004 |
| JP | 2005-057860 | 3/2005 |
| JP | 2006-352326 | 12/2006 |
| WO | WO 95/23460 A1 | 8/1995 |
| WO | WO98/58382 | 12/1998 |
| WO | 2009/063661 | 5/2009 |
| WO | 2010/008586 | 1/2010 |
| WO | WO2010/008586 | 1/2010 |

OTHER PUBLICATIONS

Kurzbauer, Werner, Communication under Rule 71(3) EPC dated May 23, 2012 for related appln. No. 11175503.9-2215, 60 pgs.
Burgener, et al., Amendment filed in the USPTO dated Jun. 19, 2012 for related U.S. Appl. No. 12/799,583, 3 pgs.
Englund, Terry Lee, Notice of Allowance received from the USPTO dated Jul. 5, 2012 for related U.S. Appl. No. 12/799,583, 8 pgs.
Imbernon, Lisa, Communication Pursuant to Article 94(3) EPC received from the EPO for related appln. No. 04 816 848.8-1242, dated May 18, 2011, 5 pgs.
Kurzbauer, Werner, Extended European Search Report dated Dec. 6, 2011 for related appln. No. 11175503.9-2215, 4 pgs.
Wells, Kenneth B., Office Action received from the USPTO dated Dec. 26, 2013 for related U.S. Appl. No. 13/105,743, 6 pgs.
Swonger, et al., Response filed in the USPTO dated Jan. 28, 2013 for related U.S. Appl. No. 13/105,743, 7 pg.
Mehari, Yemane, Office Action received from the USPTO dated Mar. 15, 2013 for U.S. Appl. No. 13/016,875, 83 pgs.
Sircus, Brian, Notification of Transmittal of International Preliminary Report on Patentability dated Aug. 10, 2011 for related application No. PCT/US2009/04149, 17 pgs.
European Patent Office, Invitation pursuant to Rule 63(1) EPC dated Aug. 19, 2011 for related appln. No. 11154275.9, 3 pgs.
Ohyama. Hirohito, Translation of Office Action of Japan Patent Office received from the JPO dated Aug. 7, 2012 for related appln. No. 2010-040443, 1 pg.
Peregrine Semiconductor Corporation, Response filed in the EPO dated Oct. 2, 2012 for related appln. No. 11154277.5, 14 pgs.

Englund, Terry, Notice of Allowance received from the USPTO dated Oct. 12, 2012 for related U.S. Appl. No. 12/799,583.
Englund, Terry Lee, Office Action received from the USPTO dated Aug. 18, 2011 for related U.S. Appl. No. 12/799,583, 47 pgs.
Peregrine Semiconductor Corporation, photocopy of an Article 19 Amendment Under Section 205(b) and Rule 46.5(b) PCT and clean claims for related appln. No. PCT/US2009/004149 dated May 13, 2011, 17 pages.
European Patent Office, photocopy of Communication Pursuant to Rules 161(2) and 162 EPC received from the EPO for related appln. No. 09798318.3 dated May 19, 2011, 2 pgs.
Adams, W.J., et al., "OTA Extended Adjustment Range and Linearization Via Programmable Current Mirrors", Circuits and Systems, 1991, Proceedings of the 34th Midwest Symposium on Monterey, CA, USA, May 14-17, 1991.
Bogdan, Pankiewicz, et al., "A Field Programmable Analog Array for CMOS Continuous-Time OTA-C Filter Applications", IEEE Journal of Solid-State Circuits, IEEE Service Center, Piscataway, NJ, USA, vol. 37, No. 2, Feb. 1, 2002.
Jader, et al., "A Linearly Tunable Low-Voltage CMOS Transconductor with Improved Common-Mode Stability and Its Application to gm-C Filters", IEEE Transactions on Circuits and Systems II: Analog and Digitalsignal Processing/ISSN 1057-7130, Institute of Electrical and Electronics Engineers Inc., vol. 48, No. 7, Jul. 1, 2001.
Peregrine Semiconductor Corporation, Response filed in the EPO dated Mar. 5, 2012 for related appln. No. 11175503.9, 10 pgs.
Englund, Terry Lee, Office Action received from the USPTO dated Apr. 20, 2012 for related U.S. Appl. No. 12/799,583, 20 pgs.
Meulemans, Bart, Communication received from the EPO dated Oct. 22, 2013 for related appln. No. 11154275.9, 6 pgs.
Le, Dinh Thanh, Notice of Allowance received from the USPTO dated Jan. 7, 2013 for related U.S. Appl. No. 12/460,442, 16 pgs.
Englund, Terry Lee, Office Action received from the USPTO dated Dec. 6, 2013 for related U.S. Appl. No. 13/769,780, 18 pgs.
Mehari, Yemane, Notice of Allowance received from the USPTO dated Jan. 2, 2014 for related U.S. Appl. No. 13/016,875, 15 pgs.
Tokuda, Kenji, Office Action and English translation received from the JPO dated Jul. 13, 2013 for related appln. No. 2011-518737, 10 pgs.
Kim, et al., Amendment filed in USPTO dated Jul. 12, 2013 for related U.S. Appl. No. 13/016,875, 8 pgs.
Wells, Kenneth B., Notice of Allowance received from USPTO dated Jul. 24, 2013 for related U.S. Appl. No. 13/105,743, 10 pgs.
Swonger, James, Response filed in USPTO on Jun. 12, 2013 for related U.S. Appl. No. 13/105,743, 21 pgs.
Sasaki, Satoshi, English translation of Office Action received from the JPO dated Jul. 23, 2013 for related appln. No. 2011-171908, 2 pgs.
Mehari, Yemane, Notice of Allowance received from the USPTO dated Aug. 20, 2013 for related U.S. Appl. No. 13/016,875, 17 pgs.
Chapman, Philip, "Declaration in Accordance with 37 CFR 1.56 and 1.68", dated Jun. 13, 2014 regarding U.S. Appl. No. 13/054,781, executed on Jun. 13, 2014, being filed herewith, 3 pgs.
Exhibit A, Sales Order Acknowledgment No. 100434 dated Jun. 22, 2007 from Peregrine Semiconductor Corporation to Motorola Inc., 1 pg.
Exhibit B, Sales Order Acknowledgment No. 100142 dated Mar. 30, 2007 from Peregrine Semiconductor Corporation to Motorola Inc., 1 pg.
Exhibit C, Peregrine Semiconductor Corporation's detailed Shipment Log of Peregrine's PE42510 and PE42650 parts from year 2006 through 2009, 21 pgs.
Exhibit D, "PE42510/42650 Production Tapeout Readiness Review", Mark Englekirk, Peregrine Semiconductor Corporation, Doc. No. 31/0189 Rev. 01, Oct. 30, 2007, 24 pgs.
Chapman, Philip, "Declaration in Accordance with 37 CFR 1.56 and 1.68", dated Jun. 13, 2014 regarding related U.S. Appl. No. 12/460,442, executed on Jun. 13, 2014, 3 pgs.
Maxim Integrated Products, "Charge Pumps Shine in Portable Designs", published Mar. 15, 2001, pp. 1-13.
Nork, Sam, "New Charge Pumps Offer Low Input and Output Noise", Linear Technology Corporation, Design Notes, Design Note 243, Nov. 2000, pp. 1-2.

(56) References Cited

OTHER PUBLICATIONS

Linear Technology, "LTC1550I/LTC1551L: Low Noise Charge Pump Inverters in MS8 Shrink Cell Phone Designs", Dec. 1998, pp. 1-2.
Lascari, Lance, "Accurate Phase Noise Prediction in PLL Synthesizers", Applied Microwave & Wireless, May 2000, pp. 90-96.
Texas Instruments, "TPS60204, TPS60205, Regulated 3.3-V, 100-mA Low-Ripple Charge Pump, Low Power DC/DC Converters", Feb. 2001, Revised Sep. 2001, pp. 1-18.
Imbernon, Lisa, Communication from the European Patent office for related appln. No. 048168488, dated Apr. 6, 2009, 2 pages.
Yasuike, Kazuki, English translation of an Office Action of related appln. No. 2006-525525 received from the Japanese atent Office dated Aug. 25, 2009, 3 pgs.
Englund, Terry Lee, Office Action received from related U.S. Appl. No. 10/658,154, dated Dec. 1, 2004, 26 pages.
Burgener, Mark, et al., Amendment filed in USPTO for related U.S. Appl. No. 10/658,154, dated Apr. 1, 2005, 27 pages.
Englund, Terry Lee, Office Action received from related U.S. Appl. No. 10/658,154, dated Aug. 10, 2005, 39 pages.
Burgener, Mark, et al., Amendment After Final filed in USPTO for related U.S. Appl. No. 10/658,154, dated Oct. 11, 2005, 32 pages.
Englund, Terry, Advisory Action received from the USPTO for related U.S. Appl. No. 10/658,154, dated Nov. 2, 2005, 2 pages.
Burgener, Mark, et al., Notice of Appeal filed in USPTO for related U.S. Appl. No. 10/658,154, dated Nov. 10, 2005, 1 page.
Burgener, Mark, et al., Petition for Revival of Appln. and Facts Statement filed in USPTO for related U.S. Appl. No. 10/658,154, dated Jan. 4, 2007, 4 pgs.
Englund, Terry, Not. of Non-Compliant Appeal Brief received from the USPTO for related U.S. Appl. No. 10/658,154, dated Nov. 2, 2006, 2 pages.
Burgener, Mark, et al., Amended Appeal Brief filed in USPTO for related U.S. Appl. No. 10/658,154, dated Jan. 5, 2007, 161 pages.
Burgener, Mark, et al., Pet. to Expedite Previous Petition filed in USPTO for related U.S. Appl. No. 10/658,154, dated Jan. 31, 2007, 1 pg.
McLaughlin, Kenya, Decision of Petition under 37 CFR 1.137(f) received from USPTO for related U.S. Appl. No. 10/658,154, dated Nov. 31, 2007, 1 page.
McLaughlin, Kenya, Decision Granting received from USPTO for related U.S. Appl. No. 10/658,154, dated Mar. 28, 2007, 1 page.
Englund, Terry, Office Action received from the USPTO for related U.S. Appl. No. 10/658,154, dated May 17, 2007, 52 pages.
Burgener, Mark, et al., Amendment After Re-Opening Prosecution filed in USPTO for related U.S. Appl. No. 10/658,154, dated Sep. 17, 2007, 31 page.
Englund, Terry, Final Office Action received from the USPTO for related U.S. Appl. No. 10/658,154, dated Dec. 12, 2007, 52 pages.
Burgener, Mark, et al., Not. of Appeal, Pre-Appeal Brief Req. and Pre-Appeal Brief Request for Review filed in USPTO for related U.S. Appl. No. 10/658,154, dated May. 18, 2008, 7 pages.
Englund, Terry, Not. of Non-Compliant Appeal Brief received from the USPTO for related U.S. Appl. No. 10/658,154, dated Apr. 1, 2009, 2 pages.
Burgener, Mark, et al., Amended Appeal Brief filed in USPTO for related U.S. Appl. No. 10/658,154, dated Jun. 1, 2009, 175 pages.
Englund, Terry, Interview Summary received from the USPTO for related U.S. Appl. No. 10/658,154, dated Oct. 9, 2009, 3 pages.
Burgener, Mark, et al., Stmt. of Substance of Interview filed in USPTO for related U.S. Appl. No. 10/658,154, dated Nov. 9, 2009, 20 pages.
Burgener, Mark, et al., Amendment filed in USPTO for related U.S. Appl. No. 10/658,154, dated Dec. 2, 2009, 19 pages.
Englund, Terry, Notice of Allowance received from the USPTO for related U.S. Appl. No. 10/658,154, dated Jan. 11, 2010, 22 pages.
Burgener, Mark, et al., Issue Fee Transmittal filed in USPTO for related U.S. Appl. No. 10/658,154, dated Mar. 23, 2010, 1 page.
Tran, Pablo N., Office Action received from the USPTO dated Oct. 29, 2009 for related U.S. Appl. No. 11/501,125, 19 pages.
Ebner von Eschenbach, Jennifer, Communication and Supplementary Search Report received from the EPO dated Nov. 27, 2009 for related appln. No. 05763216.8, 10 pages.
Kai, Tetsuo, Translation of an Office Action received from the Japanese Patent Office dated Mar. 29, 2011 for related Japanese appln. No. 2010-232563, 4 pgs.
Tran, Pablo N., Notice of Allowance received from the USPTO dated Oct. 6, 2011 for related U.S. Appl. No. 11/501,125, 11 pgs.
Wells, Kenneth B., Office Action received from the USPTO dated Feb. 13, 2013 for related U.S. Appl. No. 13/105,743, 55 pgs.
Tran, Pablo No., Notice of Allowance received from the USPTO dated Feb. 15, 2013 for related U.S. Appl. No. 12/903,848, 26 pgs.
Mehari, Yemane, Office Action received from the USPTO dated Mar. 15, 2013 for related U.S. Appl. No. 13/016,875, 83 pgs.
Tran, Pablo N. Notice of Allowance received from the USPTO dated Aug. 28, 2013 for related U.S. Appl. No. 12/903,848, 18 pgs.
Muelemans, Bart, Extended Search Report received from the EPO dated Oct. 22, 2013 for related U.S. Appl. No. 11154275.9, 6 pgs.
Wells, Kenneth B., Notice of Allowance received from the USPTO dated Nov. 7, 2013 for related U.S. Appl. No. 13/105,743, 11 pgs.
Le, Dinh Thanh, Notice of Allowance received from the USPTO dated Nov. 7, 2013 for related U.S. Appl. No. 12/460,442, 16 pgs.
Gentili, Luigi, Communication under Rule 71(3) EPC received from the EPO dated Nov. 14, 2013 for related appln. No. 04816848.8, 43 pgs.
European Patent Office, Communication pursuant to Rule 69 EPC received from the EPO dated Nov. 25, 2013 for related appln. No. 11154275.9, 2 pgs.
Mehari, Yeman, Notice of Allowance received from the USPTO dated Jan. 2, 2014 for related U.S. Appl. No. 13/016,875, 15 pgs.
Meulemans, Bart, Supplementary European Search Report received from the EPO dated Jan. 22, 2014 for related appln. No. E09798318, 6 pgs.
Moon, et al., "Design of a Low-Distortion 22-kHz Fifth-Order Bessel Filter", IEEE Journal of Solid State Circuits, Dec. 28, 1993, No. 12, New York, US, pp. 1254-1263.
Matsumoto, Yasunori, English Translation of Office Action of Japan Patent Office dated Feb. 4, 2014 for related appln. No. 2012-243547, 2 pgs.
Peregrine Semiconductor Corporation, Response filed in the EPO dated Jan. 8, 2014 for related appln. No. 04816848.8, 13 pgs.
European Patent Office, Communication pursuant to Rules 90(2) and 70a(2) EPC received from EPO dated Feb. 14, 2014 for related appln. No. 09798318.3, 1 pg.
Gundlach, Susanne, Communication under Rule 71(3) EPC received from the EPO dated Feb. 14, 2014 for related appln. No. 04816848.8, 44 pgs.
Sakurada, Masaki, Office Action and English translation of Japanese Office Action received from the JPO dated Mar. 4, 2014 for related appln. No. 2011-171908, 20 pgs.
Le, Dinh Thanh, Notice of Allowance received from the USPTO dated Mar. 12, 2014 for related U.S. Appl. No. 12/460,442, 12 pgs.
Mehari, Yemane, Notice of Allowance received from the USPTO dated Apr. 14, 2014 for related U.S. Appl. No. 13/016,875, 12 pgs.
Toscano, Oliveros, Communication under Rule 71(3) EPC dated Apr. 25, 2014 for related appln. No. 05763216.8, 47 pgs.
Peregrine Semiconductor Corporation, English translation of Response filed in the JPO filed Apr. 28, 2014 for related appln. No. 2012-243547, 5 pgs.
Tran, Pablo, Office Action received from the USPTO dated May 8, 2014 for related U.S. Appl. No. 14/052,680, 5 pgs.
Peregrine Semiconductor Corporation, Response filed in the EPO dated May 9, 2014 for related appln. No. 11154275.9, 4 pgs.
Hiltunen, Thomas J., Office Action received from the USPTO dated May 22, 2014 for related U.S. Appl. No. 13/933,006, 10 pgs.
Englund, Terry Lee, Office Action received from the USPTO dated May 23, 2014 for related U.S. Appl. No. 13/932,996, 13 pgs.
Burgener, et al., Response filed in the USPTO dated Jun. 3, 2014 for related U.S. Appl. No. 13/769,780, 17 pgs.
Peregrine Semiconductor Corporation, Response and English translation filed in the JPO dated Jun. 3, 2014 for related appln. No. 2011-171908, 21 pgs.

(56) References Cited

OTHER PUBLICATIONS

Tran, Pablo, Office Action received from the USPTO dated Feb. 3, 2012 for related U.S. Appl. 12/903,848, 46 pgs.
Fedi, Giulio, Extended Search Report received from the EPO dated Mar. 5, 2012 for related appln. No. 11154277.5, 8 pgs.
Adams, W. J., et al., "OTA Extended Adjustment Range and Linearization Via Programmable Current Mirrors", Circuits and Systems, 1991, Proceedings of the 34th Midwest Symposium on Monterey, CA, USA 14-17 May 14, 1991.
Bogdan Pankiewicz, et al., "A Field Programmable Analog Array for CMOS Continuous-Time OTA-C Filter Applications", IEEE Journal of Solid-State Circuits, IEEE Service Center, vol. 37, No. 2, Feb. 1, 2002.
Jader, et al., "A Linearly Tunable Low-Voltage CMOS Transconductor with Improved Common-Mode Stability and Its Application to gm-C Filters", IEEE Transactions on Circuits and Systems II: Analog and Digitalsignal Processing, vol. 48, No. 7, Jul. 1, 2001.
Peregrine Semiconductor Corporation, Amendment filed in the EPO dated Mar. 5, 2012 for related appln. No. 11175503.9, 10 pgs.
Ghilini, Marie, Communication under Rule 71(3) EPC received from the EPO dated May 23, 2012 for related appln. No. 11175503.9, 60 pgs.
Wang, Chi-Chang, et al., "Efficiency Improvement in Charge Pump Circuits", IEEE Journal of Solid-State Circuits, vol. 32, No. 6, Jun. 1997, pp. 852-860.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical Mosfet's with $Si_{1-x-y}Ge_xC_y$ Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Cherne, et al., U.S. Statutory Invention Registration, Registration No. H1435, May 2, 1995.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Hittite Microwave, Floating Ground SPNT MMIC Switch Driver Techniques, 2001.
Caverly, et al., "Gallium Nitride-Based Microwave and RF Control Devices", 2001.
Sedra, et al., "Microelectronic Circuits", University of Toronto, Oxford University Press, Fourth Edition, 1982,1987,1991,1998, pp. 374-375.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Peregrine Semiconductor Corporation, Response filed in the EPO dated Oct. 2, 2012 for related appln. No. 11154277.55, 14 pgs.
Tran, Pablo, Notice of Allowance received from the USPTO dated Oct. 26, 202 for related appln. No. 12/903,848, 14 pgs.
Englund, Terry Lee, Office Action received from the USPTO dated Apr. 5, 2011 for related U.S. Appl. No. 12/799,583, 5 pgs.
Burgener, et al., Amendment filed in the USPTO dated Jun. 6, 2011 for related U.S. Appl. No. 12/799,583, 7 pgs.
Burgener, et al., Amendment filed in the USPTO dated Feb. 17, 2012 for related U.S. Appl. No. 12/799,583, 24 pgs.
Englund, Terry Lee, Final Office Action received from the USPTO dated Apr. 20, 2012 for related U.S. Appl. No. 12/799,583, 20 pgs.
Burgener, et al., Comments on Examiner's Statement of Reasons for Allowance filed in the USPTO dated Jan. 14, 2013 for related U.S. Appl. No. 12/799,583, 3 pgs.
Le, Dinh Thanh, Notice of Allowance received from the USPTO dated Jul. 7, 2014 for related U.S. Appl. No. 12/460,442, 15 pgs.
Englekirk, Robert Mark, Response filed in the USPTO dated Aug. 25, 2014 for related U.S. Appl. No. 13/932,996, 14 pgs.
Englund, Terry Lee, Final Office Action received from the USPTO dated Sep. 18, 2014 for related U.S. Appl. No. 13/796,780, 25 pgs.
Imbernon, L., Decision to Grant a European patent pursuant to Article 97(1) EPC received from the EPO dated Jul. 3, 2014 for related appln. No. 04816848.8, 2 pgs.
Peregrine Semiconductor Corporation, Response filed in the EPO dated Aug. 19, 2014 for related appln. No. 09798318.3, 20 pgs.
Wells, Kenneth, Office Action received from the USPTO dated Oct. 20, 2014 for U.S. Appl. No. 14/230,945, 5 pgs.
Swonger, et al., Response filed in the USPTO dated Dec. 18, 2014 or appln. No. 14/230,945, 6 pgs.
Englekirk, Robert Mark, Response filed in the USPTO dated Nov. 13, 2014 for appln. No. 13/933,006, 12 pgs.
Burgener, et al., Response After Final Office Action filed in the USPTO dated Dec. 18, 2014 for appln. No. 13/769,780, 21 pgs.
Le, Dinh Thanh, Notice of Allowance received from the USPTO dated Jan. 2, 2015 for appln. No. 12/460,442, 23 pgs.
Englund, Terry Lee, Advisory Action received from the USPTO dated Jan. 6, 2015 for appln. No. 13/769,780, 12 pgs.
Englund, Terry Lee, Final Office Action received from the USPTO dated Jan. 20, 2015 for appln. No. 13/932,996, 65 pgs.
Wells, Kenneth, Office Action received from the USPTO dated Jan. 20, 2015 for appln. No. 14/230,945, 13 pgs.
Hiltunen, Thomas, Final Office Action received from the USPTO dated Jan. 23, 2015 for appln. No. 13/933,006, 68 pgs.

\* cited by examiner

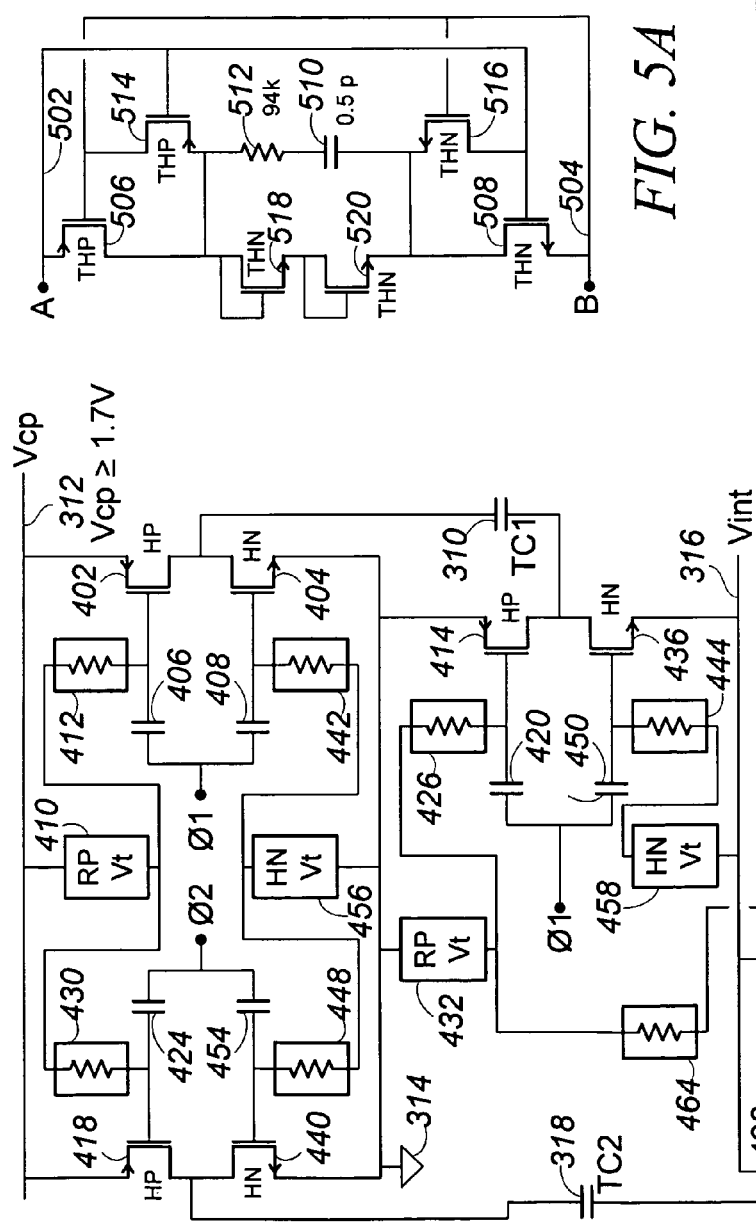
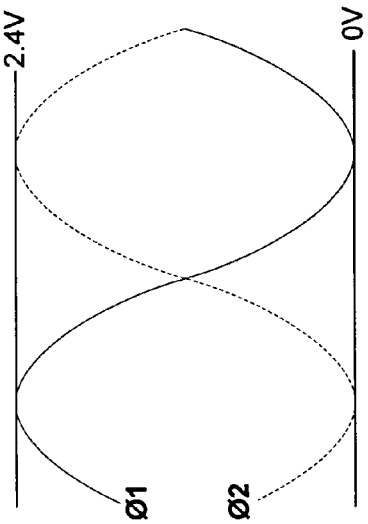
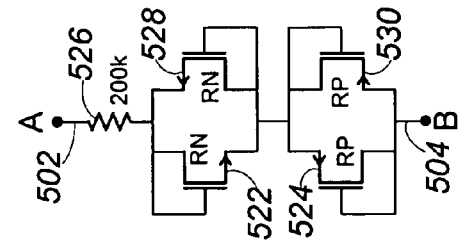
FIG. 4
FIG. 5A
FIG. 5B

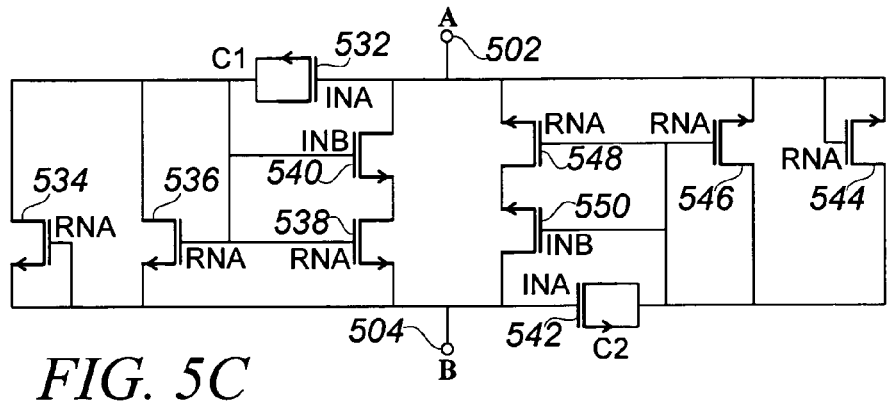
FIG. 5C
FIG. 6A
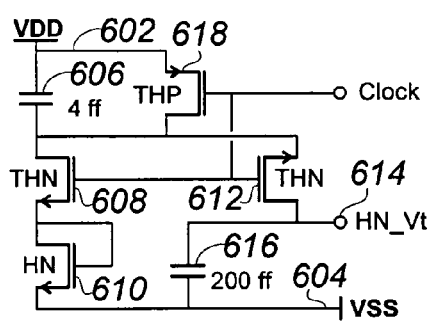
FIG. 6B
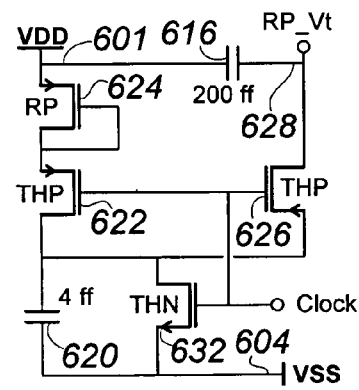
FIG. 6C
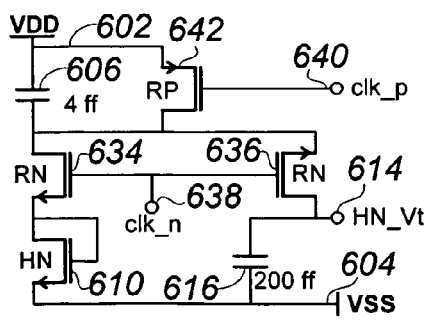
FIG. 6D
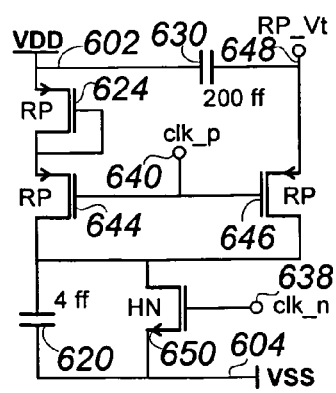

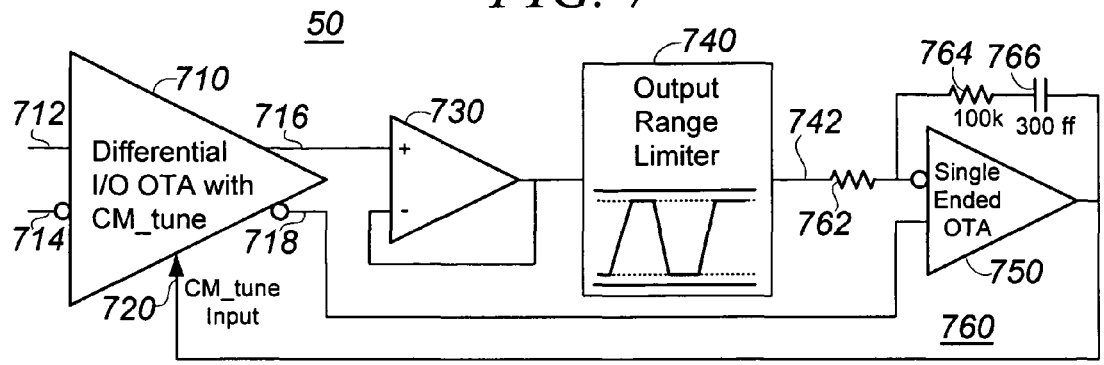
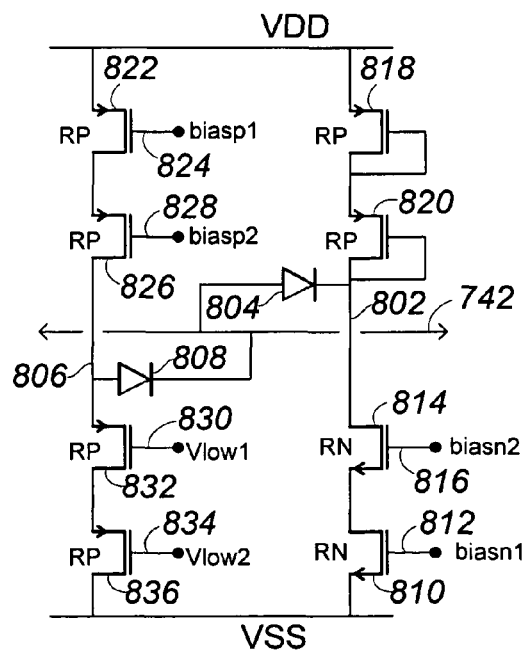

LOW-NOISE HIGH EFFICIENCY BIAS GENERATION CIRCUITS AND METHOD

This patent application is a national stage application filed pursuant to 35 U.S.C. §371 of international application number PCT/US2009/004149 filed Jul. 17, 2009 (published Jan. 21, 2010 as publication number WO/2010/008586 A2), which application claims priority to U.S. application No. 61/135,279 filed Jul. 18, 2008 and entitled "Low Noise Charge Pump with Common-Mode Tuning Op Amp", the entire contents of which are hereby incorporated by reference herein, and hereby incorporates by reference the entire contents of U.S. patent application Ser. No. 10/658,154 filed Sep. 8, 2003 and entitled "Low Noise Charge Pump Method and Apparatus", issued May 18, 2010 as U.S. Pat. No. 7,719,343. The above-identified U.S. provisional patent application No. 61/135,279 filed Jul. 18, 2008 and international application number PCT/US2009/004149 filed Jul. 17, 2009 are hereby incorporated by reference herein in their entirety.

BACKGROUND

1. Field

The present disclosure is widely applicable to electronic integrated circuits ("ICs").

2. Related Art

It is usually desirable for an IC to operate from a single voltage supply. However, many ICs require two or more different voltage supplies, for example to provide internal bias supplies, for ideal operation. Such different supplies can be provided externally to the integrated circuit, but this is undesirable from a user standpoint. Providing additional supplies is not only inconvenient for the user, but may also cause the conductors coupling such external supplies to the IC to be unduly long, which among other difficulties may cause undesired emissions if noise is present on the supply. As such, it is a common practice to provide auxiliary circuitry on ICs to generate such additional bias generation voltages, or other voltage supplies, as may be required for circuit operation needed. Charge pumps are one of the most common of such auxiliary voltage-generating circuits used in ICs.

However, charge pumps have characteristics that have rendered them difficult to use in certain applications. In particular, charge pumps have invariably created a substantial amount of electrical noise. Regulations have been promulgated to prevent electronic devices from interfering with each other, and such regulations establish maximums for allowable emissions. In some applications the noise generated by a charge pump may cause the IC or system in which such IC is disposed to exceed such maximum permitted noise emissions.

For example, most radios, cell phones, TVs, and related equipment today require an "RF switch" to control connections between various transmitter and receiver circuits ("RF" is used generically herein to mean any reasonably high frequency ac signal). At least one auxiliary voltage generator is often needed to satisfactorily bias the FETs that comprise a semiconductor RF switch. Many of the products that employ RF switches are transceivers, such as cell phones, that are subject to stringent regulatory limitations on the electrical signals that it is permitted to emit. Because such RF switches are directly connected to the transceiver antenna, even very small amplitude noise signals generated by the bias generator of the RF switch will be all too efficiently radiated. It has been found that the noise generated by a conventional charge pump may be sufficient to cause a cell phone employing an RF switch using such charge pump to exceed the maximum noise emissions permitted by applicable regulations. As such, a noisy charge pump can render such a cell phone unsuitable for its commercial purpose.

Consequently, bias generation circuits, such as charge pumps that generate far less noise than conventional charge pumps are crucial for certain applications. Low noise bias generation circuits will find advantageous employment in a wide range of integrated circuits, whether to satisfy regulatory spurious emission limits, or to avoid interference with other local circuitry. Such circuits must also be efficient in terms of integrated circuit area consumed, and, especially for battery operated devices such as cellular telephones, must be efficient in terms of power consumption.

Additionally, it is often useful to control an output voltage of a charge pump by means of a feedback control loop that includes a differential-input operational transconductance amplifier ("OTA"). OTA output common mode voltages include the effects of various offsets, including input signal misalignment, differential input offset voltages, finite gain of input common mode signals, and other mismatches that may occur throughout the OTA. Nulling the effect of such offsets is particularly useful for amplifying small signals. Adjusting output voltage levels is also useful for permitting maximum gain before the signal is clipped.

The method and apparatus presented herein address the need for low-noise, high efficiency bias generation circuits, including charge pumps, regulation control and amplification circuits, bias level setting circuits and, particularly for the capacitive coupling of low-noise clocking waveforms, efficient active bias circuits. Various aspects of the bias generation method and apparatus described herein will be seen to provide further advantages, as well.

SUMMARY

A bias generation method and apparatus is set forth that may generate bias voltage supplies quietly and efficiently by means of a charge pump that alternately couples charge from an input supply to a transfer capacitor and then couples the charge to an output, and may couple bias voltages to nodes requiring biasing by means of "active bias resistor" circuits. A variety of novel features are described and employed to achieve such bias generation. Many charge pump topologies are possible, some of which are set forth in U.S. patent application Ser. No. 10/658,154, which is incorporated by reference; many charge pump clock oscillators are suitable, especially that produce waveforms having limited harmonic content above a fundamental frequency, which may be substantially sine-like, and which moreover may include two waveforms substantially symmetric and in phase opposition. Such charge pump clocks may be coupled to transfer coupling switch control nodes via capacitance, and the nodes may be biased to selected levels by means of charge conducted by active bias resistors that may not have any substantial resistance at all. Moreover, the bias voltage generation may be controlled by an amplifier loop that includes an operational amplifier circuit having a controllable current mirror ratio, which may permit common mode control of differential outputs from the amplifier.

One important aspect of the bias generation circuits and method is a focus on minimizing the extent to which a charge pump creating bias voltages generates and transfers electrical noise to nearby circuits and devices with which the charge pump is associated. Some features of the bias generation circuits and method aid in reducing such noise generation and conduction, while others serve to permit bias generation to be efficient in terms of integrated circuit area and power consumption while employing such noise reduction features. Any one or more of these various features may be combined in bias generation circuits and methods that generate reduced interference.

Because the clock that controls a charge pump or other clocked bias generation circuits is both a direct and an indirect source of undesirable electrical noise currents, characteristics of the clock define some embodiments of the bias generation circuits and method. Embodiments may be defined by the clock they employ to control switching devices in a charge pump, according to any combination of one or more of the following features, each of which contribute to low noise generation in a charge pump. Because it is desirable for the output to have low harmonic content, one distinguishing feature of an embodiment of a charge pump is a clock with an output having low harmonic content as defined by any of the specific harmonic content limits set forth herein. As harmonic content of a clock output is reduced it generally becomes more sinusoidal, so such a clock output may be defined as substantially sine-like. Alternatively, the harmonic power divided by the power at the fundamental frequency fo (i.e., total harmonic distortion "THD"), may be limited to not more than −5 dB, or −10 dB, or −20 dB, or even −30 dB. As a further alternative, such a clock output may be defined as restricted to having third harmonic power that is less than −20 dB, −30 dB, or −40 dB compared to the power at fo. The clock waveform may also be described as containing amplitudes of each harmonic of the fundamental frequency that decrease by at least 20 dB per decade, or by at least 30 dB per decade, or at least 40 dB per decade. Thus, for a waveform having a fundamental operating frequency fo of 8 MHz and an amplitude $A_1$ for its 8 MHz sinusoidal wave component, the amplitude $A_N$ of every harmonic sinusoidal component at frequency N*fo, N an integer, may be required to be no greater than $A_1$ reduced by 20, 30 or 40 dB/decade, i.e., $A_N$ (dBA)≤$A_1$ (dBA)−2*N, or $A_N$ (dBA)≤$A_1$ (dBA)−3*N, or $A_N$ (dBA)≤$A_1$ (dBA)−4*N. Which of these varying quality levels is required for the clock waveform will typically depend upon the problem, based on a particular hardware implementation in combination with desired emission limits, which the embodiments described herein are employed to solve.

Low harmonic content signals are not readily produced, or reproduced, by digital circuits, which leads to several features that distinguish and define embodiments of a bias generation method or apparatus with reference to their controlling clocks. Embodiments of certain charge pumps may be defined by having their clock output(s) capacitively coupled to most or all transfer capacitor switches they control, which is rendered advantageous for suitable low-harmonic clock signals due to the limitations of digital circuits. Also, particularly because suitable clock waveforms typically drive a switch into conduction with only half of the peak-to-peak amplitude, it is important that the waveform be large compared to the supply available to generate it. Suitable clock waveforms may be required to have a peak-to-peak amplitude that is at least 95%, 98% or 99% of the amplitude of a supply from which such clock is generated.

As an aid to biasing capacitively coupled control signals to the transfer capacitor switching devices, it may be helpful to employ active bias "resistors," active circuits that couple a bias voltage on a first node to a second node coupled to a transistor control node. A goal is to couple the first node bias voltage to the second node without unduly reducing the amplitude of an alternating drive signal also applied to the second node, which drive signal may be oscillating and may moreover be substantially sine-like. Embodiments of such active bias-coupling circuits may be configured to substantially reduce, compared to the voltage between the two nodes, a voltage appearing across an impedance limiting current between the two nodes, or alternatively may entirely avoid the presence of significant resistors and limit current conduction by capacitive charging, with further current through active devices as may be suitable. They may also substantially preclude current from flowing between the first and second nodes when a voltage therebetween is small compared to peak voltages between the nodes, small being defined as less than about 0.4V, or about 0.8V, or about 1.2V, or being alternatively defined as less than about 25%, or about 50%, or about 70% of the peak voltages. Embodiments may further comprise a capacitive element to charge to a portion of the peak voltage between the first and second nodes, and may be a bridge circuit whereby alternating polarity voltage between the two nodes causes a varying but unipolar voltage across a current limiting circuit. The current limiting circuit comprises a series circuit of a resistor of less than about 10 MΩ, a capacitance that may be shorted, and an active current limiting circuit that may be shorted. The current limiting series circuit may be disposed in parallel with a bypass circuit to conduct non-linearly greater currents for node voltages that exceed a selected voltage.

The transfer capacitor switching devices each have a corresponding threshold voltage Vth at which they begin conducting, and in general should be biased to a voltage related to such Vth. To provide a reference for such bias voltage without unduly absorbing supply current, a switched-capacitor bias supply circuit is described. Embodiments discharge (or charge) a capacitive element during first periodic portions of a clock signal, and charge (or discharge) it through a diode-connected device during second periodic portions of the clock signal while the device is coupled to an output storage capacitor. Such bias supplies may use a single clock signal, or may use a plurality of clock signals, which may differ from each other in phase relationship and/or average voltage level. Such bias supplies may be particularly configured to function with sine-like clock signals.

Because producing two clock phases that are matched and have appropriate characteristics is difficult, a further separate definition of a charge pump clock is having two phases generated by a ring oscillator that may have any odd or even number of inverter stages coupled in a ring, including at least one differential inverter stage. Differential inverter stages may each have "first" and "second" inverter sections, and all "first" inverter sections may be sequentially coupled in the ring and all "second" inverter sections also sequentially coupled in the ring, except that ring oscillators employing an even numbers of inverter sections will cross-couple the outputs of one inverter section by coupling its "first" output to a sequentially next inverter section "second" input, and its "second" output to the sequentially next inverter section "first" input. Ring oscillators having an even number of inverter stages may also be required to include a startup circuit. Such a startup circuit may sense a non-oscillation condition, or more particularly a common mode stage output condition, and thereafter may provide an oscillation drive signal, which may more particularly be a drive that separates output voltages of one of the differential inverter stage outputs. Differential ring oscillators having an odd number of inverter stages may be further required to include a phase locking circuit to ensure differential phasing; an appropriate phase locking circuit may include two additional inverter stages coupled in anti-parallel between the inputs and outputs of an otherwise ordinary differential inverter stage, or else a pair of capacitors similarly cross-coupled. Whether a ring oscillator is differential or not, it may be advantageous for producing low harmonic content output(s) to limit the number of inverter stages, because fewer stages tend to produce a desirably less square output waveform; consequently, a charge pump clock may be defined as limited to 2, 3 or 4 inverter stages.

A control circuit may be employed to regulate a charge pump output voltage to a desired value. An amplifier circuit is needed for such control, and accordingly embodiments of an operational transconductance amplifier (OTA) are described, but the OTAs are suitable for general application. A differential amplifier circuit (OTA-diff amp) of the OTA has differential inputs coupled to the transistor control nodes in a differential pair of transistors having common drains coupled to a shared current source circuit. The OTA-diff amp includes an additional variable ratio current mirror input node, a signal applied to which substantially controls a ratio between sensed current in the drain branch of one of the differential input pair transistors, and current mirroring such sensed current in the drain branch of the other transistor of the differential input pair. The variable ratio current mirror input may be used, for example, to affect a gain of the OTA-diff amp, or for controlling an output voltage level. A differential output OTA may have two variable ratio current mirror OTA-diff amps sharing opposite input nodes, and further may control the variable current mirror ratio for each of the OTA-diff amps from a single common mode control input. An independent loop driving the common mode control input may be configured to control common mode voltage levels of the two outputs of the differential output OTA to a selectable level, or may cause voltage levels of one of the two outputs to track voltage levels of the other output, which may nullify effects of input misalignment and/or may enhance gain of one of the OTA-diff amps.

Embodiments of the bias generation method or apparatus may employ any combination of individual aspects of the method or apparatus, and may be employed in a wide range of bias generation architectures and configurations.

BRIEF DESCRIPTION OF THE DRAWINGS

Embodiments of the present invention will be more readily understood by reference to the following figures, in which like reference numbers and designations indicate like elements.

FIG. 4 is a more detailed block diagram showing circuit elements of an exemplary charge pump.

FIGS. 5A, 5B and 5C schematically illustrate three active bias coupling circuits.

FIGS. 6A, 6B, 6C and 6D schematically represent circuits for producing a bias voltage while consuming reduced current from the supply, including representations for producing two different bias voltages using a single clock phase, and representations for producing the two different bias voltages using two related clock signals.

FIG. 7 is a block diagram of an exemplary high gain amplifier circuit for use in controlling an output voltage of a charge pump.

FIG. 8 schematically represents a circuit for selectably limiting a range of an amplifier output signal.

FIGS. 12A and 12B schematically illustrate two exemplary current limited differential inverter stages for a ring oscillator, the stage having an anti-parallel locking circuit to ensure phase opposition the differential outputs.

FIG. 13 schematically illustrates a current limited differential inverter stage of a ring oscillator and optional cross-coupled capacitors to ensure output phase opposition of the stage.

DETAILED DESCRIPTION

Figures 1, 2A, 2B, 3:
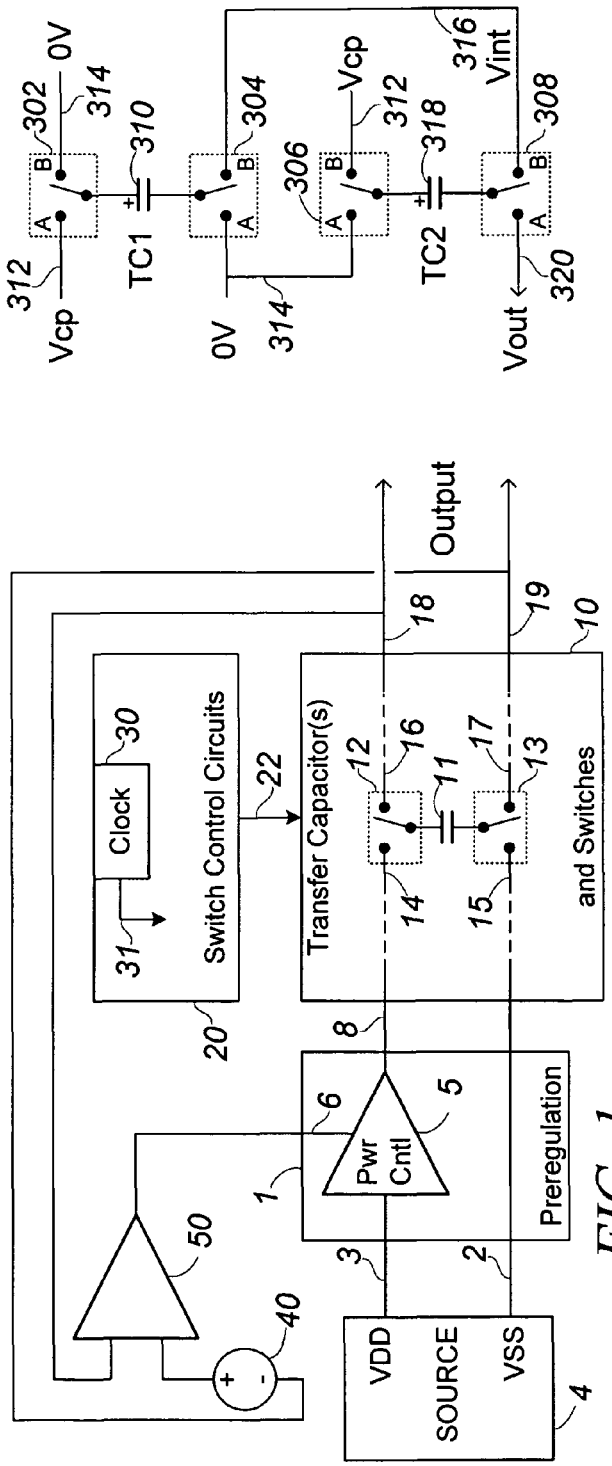
FIG. 1 is a simplified block diagram of a charge pump circuit configured to produce a regulated output voltage that is higher than or opposite in polarity to a source voltage.
FIG. 2A is a highly simplified representation of a charge pump in which a charge pump clock conducts substantial current through a transfer capacitor.
FIG. 2B illustrates that a charge pump clock as shown in FIG. 2A may be seen as comprising a separate pre-clock that does not conduct significant current through a transfer capacitor in combination with separate transfer capacitor switching circuits.
FIG. 3 represents an architecture by which an exemplary embodiment produces an output voltage of approximately negative two times a supply voltage.

The bias generation circuits described herein are fabricated on integrated circuits, providing bias and other supply voltages. A bias generation method or apparatus may employ one or more charge pumps to develop bias voltages. Charge pumps, as that term is used herein, are defined by a process of storing charge from an input supply on a transfer capacitor, then switching the nodes to which the transfer capacitor is coupled so as to transfer some portion of that stored charge to an output supply. The charge pumps described are expected to be entirely within a single monolithic integrated circuit, except perhaps for filtering components such as external capacitors.

As was developed in the related U.S. patent application Ser. No. 10/658,154 filed Sep. 8, 2003, entitled "Low Noise Charge Pump Method and Apparatus" and incorporated herein by reference, a sinusoidal or sine-like charge pump clock output can reduce harmonic noise generation by the charge pump, particularly if the sine-like clock output is itself generated in a manner that generates little harmonic noise. Capacitive coupling of the clock signal may be useful to ensure that such an analog waveform can control the variety of switching devices necessary to pump charge from a source supply to a different output supply, while ensuring that simultaneous conduction is avoided for all switching devices that are disposed in series across supply rails (or other low impedance nodes). In order for such coupling to work as intended, it is helpful to bias the switching devices very precisely, so that conduction to and from the transfer capacitors (sometimes called "fly" capacitors) can occur for as much of the available time as possible, and with switch impedance as low as possible.

These desirable conditions are best met by generating a charge pump output that is substantially sine-like, or at least has limited harmonic content compared to a sine wave, and which has an amplitude as large as possible in view of the voltage capabilities of the semiconductor process by which the integrated circuit containing such a charge pump is fabricated. Bias generation, more generally, may additionally require precise bias levels to be generated and conveyed to the switches without consuming excessive power or integrated circuit area.

Bias supplies often need to be regulated, for which purpose case low current, high gain amplifiers are useful. The amplifiers used in an exemplary quiet, regulated charge pump have unusual features that are of wide applicability. Examples are described herein of various aspects of quiet, efficient bias generation.

Note that "output supplies" or "additional supplies", or even "voltage supplies" all refer to pairs of nodes within a circuit, a supply node and a reference node. The circuit creating such supplies are generally designed to maintain the difference between the node pair at a constant, DC (direct current) or zero frequency voltage. Other circuits will typically interact with such supplies, causing them to have variations. However, except in the case of a variable-output supply, such variations in voltage are incidental, and will be attenuated with respect to the source of such changing signals. Supply voltages are designed to remain substantially constant under conditions of varying loads placed upon the voltage, and their success at this function is often a primary measure of their quality. Variable-output supply voltages may be varied in value from time to time under control of a control level, but even then will be expected to remain substantially constant for times in excess of seconds, and to be changed only according to operating condition circumstances. Voltages that are periodically changed to substantially different levels to turn on and off one or more circuit elements are not supplies, or supply voltages, but are control signals or control voltages. This distinction, well understood though it is by most persons of skill in the art, is explained here because it is occasionally misapprehended.

Overview

FIG. 1 illustrates the basic topology of an exemplary embodiment of the subject bias generation circuits and method with a block diagram that identifies functional blocks of a pre-regulated charge pump. A preregulation block 1 is connected to a reference node 2 and a supply node 3 of a source supply 4. Under control of a feedback signal 6, a power control circuit 5 provides a controlled supply 8 that becomes the input to a switched transfer capacitor circuit 10. The switched transfer capacitor circuit 10 includes one or more transfer capacitors 11 that are coupled via switches, as represented by switch blocks 12 and 13, to couple during some time periods to source connections 14 and 15, and to couple during other time periods to output connections 16 and 17. There may be a plurality of transfer capacitors 11, and the source (14, 15) and output (16, 17) to which the transfer capacitors are coupled may be intermediate sources or outputs that are only indirectly related to the regulated source connections 8, 2 or the regulated output connections 18 and 19. The switch blocks 12 and 13 represent any number of electronic switches, such as FETs, that serve to connect the terminals of the transfer capacitor(s) as necessary. These switches are controlled by switch control circuits 20 via connections 22, under control of an output signal 31 of a clock generator 30.

Feedback circuitry 50 compares the output supply 18 (with respect to the output reference 19) to a reference voltage provided by a voltage reference 40. The feedback circuitry 50 produces a control signal that controls the power control circuit 5. In the exemplary embodiment, a premium is placed on keeping voltages within the switched transfer capacitor circuits to a minimum. Pre-regulation ensures that the charge pump source Vcp 8 coupled to the switched transfer capacitor circuit 10 will be no greater than necessary to provide the desired output voltage. As an alternative to such a pre-regulation topology, a regulation element similar to pre-regulator 1 may be disposed after the switched transfer capacitor circuit 1 but before the output supply connections 18 and 19, and may be similarly controlled by control signal 6.

Transfer Capacitor Switching Topology

Before turning to an exemplary topology, a distinction between two classes of such topologies is noted. A first class of charge pump topologies are designated "control only clock" topologies, and are distinguished by the fact that they do not transfer significant current between the charge pump clock(s) and any transfer capacitors controlled by such clocks. A second class of charge pump topologies are designated "current transfer clock" topologies, and are distinguished by the fact that they include a charge pump clock output that is a primary source of current ultimately conveyed to the output via the transfer capacitor(s).

FIG. 1 is a block diagram of an example of a "control only clock" topology charge pump. Switches are arrayed around the transfer capacitor(s) 11 as needed (e.g., as represented by switch blocks 12 and 13). Such "transfer capacitor switches" couple charge into and out of the transfer capacitors, from a source or to an output. The switch control circuits 20, and in particular the output 31 of the charge pump clock 30 that drives such control circuits, provide only control signals to the transfer capacitor switches (12, 13). While some finite current will likely be conducted from the clock output 31 and control circuits 20 into the transfer capacitor(s) 11, any such current is not substantial, but is merely incidental to providing control. For example, currents due to parasitic gate capacitances if the switches are comprised of FETs, or base currents if the switches include bipolar transistors, may enter the transfer capacitors incidentally, but are not significant compared to the currents that the transfer capacitor switches intentionally conduct into and out of the transfer capacitor(s) 11.

FIG. 2A is a block diagram illustrating a simple example of "current transfer clock" topology charge pump, in which an output 32 of the charge pump clock 3000 is coupled to a terminal 34 of a transfer capacitor 11 so as to supply substantial current into the transfer capacitor 11, and ultimately to the output supply 26 for storage on a smoothing capacitor 28. Transfer capacitor coupling switches, such as represented in a switch block 24, may be controlled by the charge pump clock by means of switch control circuitry 20 via connections 22. However, the transfer capacitor coupling switches may also be devices, such as diode-connected FETs, that can be controlled by the charge pump clock via the transfer capacitor 11 without a need for direct control lines 22. In any event, the distinguishing characteristic of this class of charge pump topologies is that the output from a charge pump clock 3000 directly provides substantial current to a transfer capacitor 11.

The distinction between these two classes of charge pumps must be understood to avoid confusion when comparing different charge pumps, and particularly different charge pump clocks. However, in some sense the distinction is largely a matter of drawing convention. FIG. 2B illustrates blocks internal to the charge pump clock 3000 of FIG. 2A, including switches 3012 that couple the nominal clock output 32 to either a source connection Vs1 3014 or a source connection Vs2 3015, under control of an output 3031 of a "pre-clock" block 3030. Thus, at least in such instances, observation of clock design details permits the charge pump of FIG. 2A to be seen as a "control only clock" topology that has simply been drawn in a manner that lumps important switching features into a block labeled "clock." In particular, the pre-clock 3030 may be seen to be a "control only" charge pump clock having an output 3031 that controls switches 3012 but does not conduct current directly to a transfer capacitor (connected to 32, but not shown). Thus, current to the transfer capacitor, via 32, comes not from the preclock 3030, but from sources Vs1 3014 and Vs2 3015 under control only of the pre-clock 3030. Nonetheless, many charge pump references omit the details of the charge pump clock output drive circuitry that would permit such recharacterization. Consequently, when comparing charge pumps as described in different references, it is important to bear in mind the distinctions between "control only clock" topologies and "current transfer clock" topologies.

An exemplary transfer capacitor switching topology for providing a doubled and inverted output is illustrated in the block diagram in FIG. 3. The transfer capacitor coupling switches are represented by switch blocks 302, 304, 306 and 308, all of which may be considered to alternate between position A (during even time slots) and position B (during odd time slots). Thus, during an even time slot switch blocks 302 and 304 are in position A, so a first transfer capacitor TC1 310 is charged to a voltage Vcp by being coupled between a source connection 312 (Vcp) and source connection 314 (0V). During the next odd time slot all four switch blocks go to position B. The positive terminal of TC1 310 is coupled to 0V and the negative terminal to an intermediate point Vint 316, which after sufficient cycles will therefore be driven close to −Vcp. During the same odd time slot, a second transfer capacitor TC2 318 will be coupled by switch blocks 306 and 308 between source connection 312 (Vcp) and the intermediate voltage Vint 316. After sufficient cycles, presuming the load is not excessive, TC2 318 will therefore be charged to nearly 2*Vcp. During even time slots TC2 318 is coupled between output 314 (0V, the same as the source connection) and output 320 (Vout). If the current drawn from output 320 (Vout) is not excessive, after sufficient cycles Vout will approach −2*Vcp. The topology of the charge pump block diagramed in FIG. 3 is of the first "control only clock" type: the charge pump clock does not provide significant current to a transfer capacitor, but instead provides only control signals to transfer capacitor switches.

FIG. 4 is a schematic block diagram illustrating some details of the exemplary transfer capacitor switching circuit. In general, the transfer capacitors TC1 310 and TC2 318 are switched in the manner shown in FIG. 3. However, a number of the detailed circuit features of FIG. 4 are unusual. The clock output is provided in the form of two opposite phases, ø1 and ø2, at about 8 MHz. To reduce noise generation and transmission, these clock signals should have limited harmonic content as described elsewhere herein. To achieve limited harmonic content, the waveform(s) should at least have well-rounded edges. More ideally, the limited harmonic content will cause the waveform to be substantially sine-like. It is also desirable, for the purpose of driving FETs as hard as possible for high efficiency, for the waveforms to have peak-to-peak amplitudes as large as practical in view of available voltages and the voltage withstand capacity between terminals of the FETs. In an exemplary embodiment, the clock output amplitude is about 2.4V (peak to peak).

The details of this circuit are specific to the semiconductor process most often used by the applicant, but the skilled person will have no trouble adjusting details to fit different semiconductor processing parameters. The process includes the following FET types, from which a majority of circuit components are fabricated. N-channel FETs include: Regular N ("RN") FETs that have a nominal threshold voltage of 450 mV, High doping N ("HN") FETs that have a nominal threshold voltage of 700 mV, and Thick oxide High doping N (THN) FETs that have a nominal threshold voltage of 900 mV. THN FETs have gate withstand voltages that are about 3.6V, compared to the 2.7V withstand of RN and HN FETs. A Depletion-mode N ("DN") is similar to HN and RN except for having a threshold voltage of about −1V, so that it is fully conducting under ordinary circumstances. It has a standard gate voltage withstand capacity. Corresponding P-channel FETs include RP (Regular), HP (High doping) and THP (Thick oxide High doping) P FETs having −400, −600 and −800 mV nominal threshold voltages, respectively. IN or intrinsic FETs may have a threshold voltage of approximately 0 V.

Most capacitors are fabricated by connecting the drain and source of a DN FET as one terminal, and using the gate as the other terminal. Such capacitors have a working voltage only equal to the standard gate voltage withstand capacity. Capacitance is reduced when an FET capacitor is biased off, which occurs when a DN FET with source and drain tied together (i.e., capacitor configured) is charged such that the gate is about 1V more negative than the channel. Therefore, adjustments must be made for large signal bipolar operation. For example, metal-insulator-metal ("MIM") capacitors may be used if linearity is crucial, or two DN FETs may be disposed in anti-parallel if linearity is not a concern. Capacitors formed of IN FETs, on the other hand, have extremely non-linear characteristics: when the voltage goes to zero, i.e. to the threshold voltage, the channel becomes substantially ineffective at creating a plate of the capacitor, and thus the capacitance goes to a very low value of perhaps 20% of the capacitance at higher voltages.

The transfer capacitor switching circuit of FIG. 4 has four voltage supply rails: a voltage Vcp 312 that is controllable from 1.7V to 2.4V; 0V 314; an intermediate voltage Vint 316 that is approximately −Vcp depending upon load; and Vout 320, which is approximately −2*Vcp depending upon load. As is described elsewhere, Vout will be controlled to have a magnitude of at least 3.4V (negative) by means of a feedback loop that controls Vcp to be greater than about 1.7V, as needed, based on a source of about 2.4V.

One terminal of TC1 310 is alternately coupled to either Vcp 312 via HP 402, a P-channel FET, or to 0V 314 via HN 404, an N-channel FET. Both devices are driven from the same clock signal ø1, capacitively coupled to the gates of the devices via coupling capacitors C 406 and C 408, respectively. Cs 406 and 408 may be fabricated as DN FETs having a gate area about 23 times larger than the gate area of their corresponding FETs HP 402 and HN 404, respectively. Because the devices are conducting only half of the time, the effective capacitance of C 406 and C 408 is roughly 46 times larger than the effective capacitance between the gate and source of the corresponding FETs they are driving. The capacitance of Cs 406 and 408 may be roughly 0.75 pF.

In the exemplary embodiment, the effective gate parasitic capacitance of HP 402 is about 1/46 that of coupling capacitor C 406. Capacitive voltage division would therefore attenuate the signal by about 2%, and the signal on the gate of HP 402 would be about 98% of the clock voltage. However, a gate bias voltage must be coupled to the gate, such as via the bias impedance Z 412. If Z 412 is a resistance; it should desirably be about 4 MΩ so as not to significantly further attenuate the gate drive signal. Depending upon the gain of the FET switches and the available magnitude of the clock signals ø1 and ø2, this may not be an issue. Depending upon process factors, it will be satisfactory in some embodiments to employ linear impedances to limit attenuation of the clock signal at the FET gates, at the clock operating frequency fo, that is less than 20%, 10%, 5%, or 3%. The bias impedance Z 412 may be a resistor, or may have inductive characteristics to achieve sufficiently low attenuation at fo.

Each of the other FET switches is also driven by either ø1 or ø2 in a similar manner, so the gain values and the values of their corresponding coupling capacitances and bias impedances will be selected according to the same considerations described with respect to HP 402. Typically, ø1 and ø2 will have the same amplitude, each HP 402, 414, 416 and 418 will have substantially similar characteristics, so each corresponding coupling capacitor C 406, C 420, C 422 and C 424 will have the same value, as will each corresponding bias impedance Z 412, Z 426, Z 428 and Z 430 and each bias voltage RP_Vt 410, 432 and 434.

Similarly as the P-channel FETs, the N-channel FET switches HN 404, 436, 438 and 440 will generally also have substantially identical characteristics as each other. Consequently, the corresponding components, including bias impedances Z 442, Z 444, Z 446 and Z 448, coupling capacitors C 408, C 450, C 452 and C 454, and bias voltages HN_Vt 456, HN_Vt 458 and HN_Vt 460, may also be identical to each other.

However, coupling ø2 to HP 416 and HN 438 requires higher voltage capacitors than the usual 3V DN FET capacitors of the exemplary semiconductor fabrication process. Accordingly, these low-voltage DN FET capacitors are disposed in series to increase the effective voltage withstand capability. Due to the circuit configuration, C 422 and C452 are made 2 times as large as other coupling capacitors, such as C 406, and C 462 is made 4 times as large, so that the effective amplitude on the gates of HP 416 and HN 438 is approximately the same as on each of the other transfer capacitor switch FET gates. The junction between C 462 and Cs 422, 452 is biased to a midpoint voltage by coupling it to RP_Vt 432 via bias impedance Z 464.

Transfer capacitor TC1 may be about 15 to 30 pF, while TC2 may also be 15 to 30 pF. Larger transfer capacitors increase efficiency, but may require a large semiconductor area. In the exemplary embodiment, TC1 and TC2 are fabricated as capacitor-connected DN FETs having a working voltage of only about 2.7V. The voltage stresses on TC2 exceed the withstand capacity of single devices, so TC2 is actually fabricated using two capacitances in series. To obtain a given capacitance, the ~6V TC2 therefore requires 4 times greater area than the ~3V TC1. In view of this area penalty, TC1 may be made relatively large (e.g., about 30 pF) while TC2 is left at 15 pF and thus is only twice the size. If a particular fabrication process has no area penalty, it would be more effective to increase both devices by about the same factor.

It is important to avoid simultaneous conduction for transfer capacitor switch pairs disposed across a low impedance source, such as HP 402 and HN 404 disposed across Vcp 312 and 0V 314. To this end, both devices are turned off when the clock drive signal is between its average value and 200 mV below that value. The average or bias voltage on the gate of HP 402 is controlled by an RP_Vt tracking source 410 as coupled to the gate via a large bias impedance Z 412. However, the threshold voltage magnitude of HP devices is about 200 mV larger (~−600 mV) than for RP devices, so the RP_Vt tracking source 410 sets the bias voltage about 200 mV smaller (~−400 mV) than the threshold voltage of the HP FETs such as HP 402 (~−600 mV). The N FETs, however, such as HN 404, are biased to their threshold voltage of about 700 mV by an HN_Vt bias supply (HN_Vt 456, for HN 404). Thus, both devices in each FET pair are biased "off" for about 200 mV out of the range of the clock signal, which in the 1.2 V peak waveform of the exemplary clock signals is equivalent to an off time of slightly over 5% of the clock half-period, or about 3.3 ns when fo=8 MHz. This small nominal off time is adequate because variations of parameters between physically close devices within these integrated circuits will be very small, and will tend to track each other across operating conditions.

Active Bias "Resistor"

In the exemplary charge pump circuit it is desired to maintain maximum clock signal amplitude on the gates of the transfer capacitor switching FETs. To avoid attenuating the gate signal amplitude, the magnitude of the bias impedances will need to be quite large, ideally about 4 MΩ in the exemplary embodiment. In some semiconductor processes a simple resistor of such magnitude may take more device area, and/or the resulting impedance may be more difficult to control, than the impedance of an extensive active circuit. An active bias impedance circuit may have a complex impedance that includes a significant inductive component. However, an active circuit that ensures the correct bias voltage on a capacitively-coupled FET gate presented with a uniform oscillating signal need not present a linear impedance at all. Instead, a completely nonlinear active circuit may be employed as an "active bias resistor" circuit.

FIG. 5A schematically illustrates one example of such an active bias resistor circuit disposed between terminals A 502 and B 504. It is a highly nonlinear bridge circuit that conducts very little current in steady-state operation. Presuming that an oscillating voltage of sufficient magnitude appears between terminals A 502 and B 504, the circuit conducts current as necessary to equalize the magnitudes of the alternating peak voltages between the A and B terminals. When the peak voltages are equal, the midpoint voltages will also be equal. In the exemplary embodiment one of the terminal voltages is a DC value (Vt), so the circuit serves to ensure that the positive and negative peaks of the other terminal are precisely balanced about the DC value.

Let Vabp be the magnitude of the peak voltage during "positive" half cycles when the voltage on terminal A 502 is greater than the voltage on terminal B 504, and let Vbap be the magnitude of the peak voltages during the other "negative" half cycles when the voltage of terminal B 504 is greater than the voltage of terminal A. When the voltage of positive half cycles exceeds the threshold of THN 508 (about 900 mV), FETs THP 506 and THN 508 are turned on, coupling the series connected C 510 and R 512 across A and B (R 512 coupled to terminal A 502). C 510 may be a capacitor-connected DN FET of about 0.5 pF, and R 510 is about 93.5 kΩ, so they form a series RC circuit establishing a pole at about 3.4 MHz. During each positive half cycle C 510 will conduct current that reflects an average value of Vab while Vab>900 mV. The same happens during the negative half cycle when the voltage of terminal B exceeds that of terminal A by 900 mV; except THP 514 and THN 516 conduct when Vba exceeds 0.9V (THP 506 and THN 508 are off). Therefore, terminal B is connected to R 512, so while Vba>900 mV, C 510 conducts current that reflects the average value of Vba during this period.

If the average value of Vab (while Vab>0.9) is greater than the average value of Vba (while Vba>0.9), more current flows from terminal A to terminal B during positive half cycles to raise the voltage on C 510. Presuming that Vba is still less than Vab, current flows out of C 510 during negative half cycles, causing a net negative current from terminal B to terminal A, equivalent to a net positive current from A to B. Thus, during each half cycle a net current moves from the higher-voltage terminal (the terminal having the higher average voltage during the period it is more than 0.9V greater than the lower terminal) and into the lower-voltage terminal (the terminal having the lower average voltage during the period that it is more than 0.9V greater than the higher-voltage terminal). Given the lack of DC current through the gate-connected terminal, this will force the two terminals to experience identical average voltages during that portion of their respective half cycles when the bridge is conducting (i.e., V>0.9V). For any waveforms between terminals A and B having positive and negative half-cycles that are symmetrical, forcing the average voltages during the conducting periods to be equal is equivalent to forcing the overall average value of each terminal voltage to be equal, thus equalizing the DC or bias voltage on the two terminals.

Current does not flow at all when the voltage across terminals A and B is less than about 900 mV. During the time that threshold is overcome, C 510 tries to charge to the average voltage during both half cycles. Presuming that the peak voltages between terminals A and B are 1.2 V and that the threshold of THNs 508 and 516 is 0.9V, current will flow for about the middle 80 degrees of each half wave, and C 510 will charge to about 1.1 V. Average currents over each half cycle will of course be zero at steady state, but the current that does flow will be non sinusoidal. FETs THN 518 and THN 520, which have a nominal combined forward voltage of 1.8 V, permit rapid bias adjustments by enabling large currents to flow when one of the peak voltages, nominally 1.2 V, reaches 1.8 V.

FIG. 5B illustrates a simple alternative circuit for setting the bias on a gate in the presence of an oscillating drive signal. When the voltage on terminal A 502 exceeds the voltage on terminal B 504 by the combined threshold voltage magnitudes for diode-connected RN 522 (~450 MV) and RP 524 (~400 mV), current flows from A to B as limited by R 526 (e.g., 200 kΩ). When the voltage on terminal B 504 exceeds that on terminal A 502 by the combined threshold voltage magnitudes for diode-connected RN 528 and RP 530, current flows from B to A as limited by R 526. Thus, net current flows from the terminal experiencing the greater average positive voltage excursions with respect to the other terminal. The threshold combinations of the two anti-parallel diode-connected FET pairs will be well matched, so the average current flow during the two half cycles will balance when the average voltages are balanced.

FIG. 5C illustrates a further alternative circuit for setting the bias on a gate in the presence of an oscillating drive signal. Unlike FIGS. 5A and 5B, FIG. 5C is completely symmetric with respect to terminals A 502 and B 504, two identical circuits being disposed between these terminals in anti-parallel. Also, the circuit of FIG. 5C does not require any large resistor at all. Instead, current limiting is achieved by a "switched capacitor" effect: the current depends on charging and discharging a small capacitor on each cycle of the input signal.

For each half cycle that $V_A$ (voltage of A 502) exceeds $V_B$ (voltage of B 504), capacitor C1 532 of only about 12.5° F. limits the charge coupled from terminal A to B. The charge would be entirely capacitive displacement current through either FET 536 (during the positive half cycle) or FET 534 (during the negative half cycle), and thus of zero average value, were it not for the current through FETs 538 and 540, which mirror only the positive half-cycle current through diode-connected FET 536. FET 540 is not essential, but mitigates Vds channel modulation of mirror FET 538. For the opposite half cycle when $V_B$ exceeds $V_A$, the anti-parallel circuit consisting of C2 542 and FETs 544, 546, 548 and 550 perform inverse-identically as C1 532 and FETs 534, 536, 538 and 540, respectively.

There are particular features of the circuit that are useful, but not essential. As one example, C1 532 is an FET configured as a capacitor, with source and drain coupled together. In an exemplary embodiment, the FET is an "INA" type, which indicates that it is "intrinsic", N-channel, and of size A (channel width 1.4 microns and length 2 microns, generally indicated as W/L=1.4/2 microns). In the particular process, the IN-type FET has a threshold voltage Vth of approximately zero volts. When Vgs (=Vgd) is less than Vth (zero), the channel of the FET practically disappears, so that the capacitance of C1 532 is only about 20% as large as when Vgs is greater than zero. In the exemplary embodiment described, C1 532 has a capacitance of approximately 12.5 fF when Vgs>0V, but only about 2.5 fF when Vgs<0V. One typical AC voltage across the terminals A and B 502 and 504 is 1.2 V peak, and the RN-type FETs have Vth of about 0.7 V. During recovery, when $V_B$ exceeds $V_A$, C1 532 eventually supports a negative voltage across its terminals of about −0.5 V. However, the amount of charge required to establish −0.5 V in this condition is only about 1/5 as much as would be required to establish +0.5V. As a result, C1 exits the "reset" half cycle with very little charge that would otherwise require displacement current when $V_A$ exceeded about 0.2V; the current is negligible until $V_A$ rises to about 0.6V. This helps keep the overall charge transfer per cycle small, so that the active bias circuit has the low current consumption of a very large value resistor. However, it requires far less integrated circuit area than such a large value resistor.

The circuit of FIG. 5C functions best when the amplitude of the oscillating waveform imposed across terminals A and B 502 and 504 has a peak value greater than Vth of FETs 536 and 538 (and the Vth of FETs 546 and 548 for the opposite half cycle). However, the only upper limit on the amplitude of the oscillating waveform across A and B is the breakdown voltage of C1 532 and FET 540 (C2 542 and FET 550 for the opposite half cycle), increased by the smallest threshold voltage Vth of FETs 534 and 536 (the smallest Vth of FETs 544 and 546 for the opposite half cycle).

The charge that is conducted by the active bias resistor illustrated in FIG. 5C on the positive half cycle is the displacement current of C1 532, plus the mirrored current in FET 538. The displacement current will flow back during the negative half cycle to reset C1 532, leaving the mirrored current in FET 538 as the net charge coupled from A 502 to B 504. On the opposite half cycle, the net current is the mirrored current through FET 548. To the extent that the threshold voltages are matched, and that the capacitance of C1 532 is equal to the capacitance of C2 542, the charge coupled from A to B will only become zero when the half-cycle amplitudes are identical. Otherwise, net current will flow, which will move the average voltage of the biased node, e.g., $V_A$, toward the bias source voltage, e.g., $V_B$. The biased node is typically the gate of a relatively large FET.

Active bias resistors, like ordinary bias resistors, cause the voltage of a selected node to go to the same average value as that of a bias voltage applied to one side of the circuit. However, active bias resistors may cause the node voltage to reach the bias level significantly more quickly than would an ordinary resistor that performed the same function and conducted the same average current. An embodiment such as illustrated in FIG. 5C may be particularly suited for such faster tracking. However, although resistors are not required for the embodiment illustrated in FIG. 5, resistors may be employed with some embodiments of this circuit. Any such resistors may, however, be limited to maximum values that do not exceed 100 k ohms, or 50 k ohms, or 20 k ohms, 10 k ohms or even 1 k ohms. Very small resistors may be used without penalty because they require very little integrated circuit real estate, but larger resistors occupy substantial space.

Vt Tracker

A threshold-setting circuit may simply be a diode-connected FET coupled to a source voltage via a limiting resistance. However, to minimize the source load for battery-powered devices, the limiting resistance may need to be very large, thereby operating the diode-connected FET at extremely low current, and also imposing an area penalty for the large resistance in many semiconductor processes. Accordingly, FIGS. 6A-D schematically illustrate switched-capacitor circuits for providing bias voltages for FETs while drawing very little charge from the source (low average current), where the clock(s) may be substantially sine-like. FIGS. 6A and 6B show Vt trackers that use a single clock phase to provide Vt for HN and RP FETs respectively. FIGS. 6C and 6D show Vt trackers that use two clock phases ø1 and ø2 to provide more robust Vt trackers for HN and RP FETs, respectively.

In FIG. 6A a source VDD 602 (less than 2.5V) with respect to VSS 604 begins to charge C 606 (4 fF) via THN 608 and HN 610 when the clock voltage rises to about 1.6 V (Vt THN ~900 mV, Vt HN ~700 mV). At about the same time, THN 612 turns on, coupling the output HN_Vt 614 and smoothing capacitor C 616 (200 fF) to C 606 and diode-connected HN 610, which sets the output level. C 606 charges to a voltage of (VDD−HN_Vt), providing current if needed to C 616. As the clock (2.4 V p-p) passes the 2.4 V peak value and returns to about 1.6 V, THNs 612 and 608 and HN 610 turn off, and THP 618 turns on, discharging C 606 and turning off THNs 608 and 612 more forcefully. This condition prevails until the clock passes the negative peak value of about 0 V and increases to about 1.6 V, at which point another cycle begins. C 606 and C 616 may be capacitor-coupled DN FETs of appropriate area.

FIG. 6B is the RP-FET analog of FIG. 6A, but Vdd 601 should be less than 2.1 V. When the clock signal declines from its peak (about 2.4V) to about 1.2 V below Vdd, which may be substantially sine-like, (i.e., less than 0.9V), C 620 (4 fF) begins to charge via THP 622 (Vt ~800 mV) and RP 624 (Vt ~400 mV). THP 626 turns on thereafter, coupling the drain of diode-connected RP 624, which sets the output voltage level, to the output RP_Vt 628, and the smoothing capacitor C 630, via THP 622. When the clock signal returns to 1.2 V below Vdd 601, RP 624, THP 622 and THP 626 turn off. THN 632 turns on when the clock signal reaches ~0.9V, discharging C 620. THN 632 should not turn on significantly before RP 624, THP 622 and THP 626 turn off, for which reason Vdd 601 should not exceed 2.1 V.

FIG. 6C schematically illustrates a switched capacitor HN_Vt tracker that employs a clock phase at two different bias points to render the circuit more tolerant of parameter variations. The supply VDD 602/VSS 604 charges C 606 (4 fF) via RN 634 and HN 610, and the Vt-setting drain voltage of diode-connected HN 610 is coupled to the output HN_Vt 614 and the smoothing capacitor C 616 (~200 fF) via RN 634 and RN 636, when the clock signal clk_n 638 exceeds about 1.15 V. Clk_n 638 may be an approximate sinusoid of about 2.4 V p-p, biased to have an average voltage of HN_Vt (about 700 mV) above VSS 604. Accordingly, clk_n 638 exceeds 1.15 V for only about the middle 136 degrees of its 180 degree positive half cycle, leaving about 22 degrees of non-conduction at each end. HN 610 sets the output level for HN_Vt at about 700 mV, and the threshold of RNs 634 and 636 are about 450 mV. Clk_p 640 is substantially identical to clk_n 638 except that it is biased to an average voltage of RP_Vt, about 400 mV below VDD 602. When clock signal clk_p 640 is more than 0.4 V below VDD 602, RNs 634 and 636, and HN 610, must be off, as RP 642 is on to discharge C 606. This condition will exist for almost exactly the full negative half cycle of the clock waveform. Note that clk_n 638 may be capacitively coupled to a clock output, and may be biased by disposing an active bias "resistor," also described elsewhere herein, between clk_n 638 and HN_Vt 614. Similarly, clk_p 640 may be capacitively coupled to the same clock output by another capacitor, and biased by disposing an active bias "resistor" between clk_p 640 and the output RP_Vt 648 of FIG. 6D. Clk_p 640 and clk_n 638 are not heavily loaded, so the same signals may be shared between the circuits of FIGS. 6C and 6D.

FIG. 6D schematically illustrates an RP Vt tracking circuit generally converse to that of FIG. 6C, and may use the same two clock signals clk_n 638 (biased to HN_Vt) and clk_p 640 (biased to RP_Vt with respect to VDD 602). During that portion of the clock negative half cycle when clk_p 640 is more than about 0.8 V below VDD 602 (0.4 V below the bias level), C 620 (4 fF) charges via threshold-setting diode-connected RP 624 and RP 644, and RP 646 couples the drain voltage of RP 624 to the output RP_Vt 648 and smoothing capacitor 630. During the positive clock half cycle, when clk_n 638 is greater than its bias level HN_Vt (about 0.7V), HN 650 is turned on to discharge C 620. HN 650 is on for approximately the entire clock positive half cycle, but does not conduct concurrently with RPs 624 and 644, and RP 646 which are on only when the clock is about 400 mV or more below its bias point, leaving about 20 degrees of nonconduction at each end of the clock signal negative half cycle.

Charge Pump Output Control Feedback Circuit Details

Block 50 of FIG. 1 is an integrating amplifier that compares the outputs 18 and 19 from the charge pump to a reference voltage provided by block 40, generating from any error a voltage 6 to control a preregulation circuit 5. Any good differential input operational amplifier may be used for block 50, but the exemplary embodiment employs some unique circuitry for this function, as outlined in FIG. 7, particularly in a differential Common Mode controlling Operational Transconductance Amplifier ("CM_OTA").

The overall integrating amplifier 50 of FIG. 7 includes a differential CM_OTA 710 having differential inputs 712 and 714, normal and inverting differential outputs 716 and 718 respectively, and a CM_tune input 720 that reduces the output common mode voltage between outputs 716 and 718 when the CM_tune input voltage is increased. The positive output 716 of the differential CM_OTA 710 provides the output drive signal to control the pre-regulator (not shown here). The gain of the differential CM_OTA 710 is controlled by an internal common-mode feedback loop within the integrating amplifier 50.

The common-mode feedback loop drives the CM_tune input 720 as necessary to adjust the common-mode voltage of the differential output of the CM_OTA 710, such that negative differential output 718 has the same average value as the positive differential output 716. A unity gain buffer 730 provides a current-limited replica of the positive output 716 of the CM_OTA 710 to a range limiter 740. A simple single-ended OTA 750 is configured as an amplifier 760 that integrates differences between the inverting output 718 of the CM_OTA and the range-limited version 742 of normal output 716. The gain magnitude of amplifier 760 is limited to 0.5 by R 762 (200 kΩ) and 764 (100 kΩ) above a frequency, set by C 766 (300 fF), of around 5 MHz, which is somewhat lower than the operating frequency fo (around 8 MHz) of the charge pump this circuit serves. In the exemplary embodiment, each of the outputs of amplifiers 710, 730 and 750 has a current drive capacity of less than 2 μA. Note that a small capacitor (~100 fF, not shown) between the inverting output 718 of the CM_OTA 710 and ground may be useful, in view of the limited current capacity, to reduce high frequency loop gain for added stability.

The output range limiter 740 is often needed because the integrator 50 is designed to operate with high gain, such that an input differential of more than a few 10 s of mV can saturate and lock up the feedback. FIG. 8 schematically illustrates a suitable range limiting circuit. The range-limited output signal 742 is prevented from going more positive than the voltage at upper limit 802 plus the forward voltage of D 804, and is prevented from going more negative than the voltage at lower limit 806 minus the forward voltage of D 808. Ds 804 and 808 may be diode-connected FETs, for example RP FETs having a forward voltage of about 400 mV. RN 810 (Vth about 450 mV) sets a current of about 1.5 μA based on a current-setting voltage biasn1, with the drain voltage of RN 810 controlled to a level set by biasn2 816 by cascode configuration of RN 814. RP 818 and RP 820 are diode connected in the exemplary embodiment, conducting all of the current set by RN 810 if the voltage of upper limit 802 is less than about 800 mV below VDD. The signal at 742 cannot exceed the forward voltage of D 804 above that voltage, or in other words the positive excursion of signal 742 is limited to about VDD-400 mV.

The signal 742 is similarly limited to be not lower than the forward voltage of D 808 (about 400 mV) below the lower limit voltage 806 without sinking all the current provided by RP 822 based on biasp1 824 with the drain voltage provided by cascode RP 826 as controlled by biasp2 828. The higher of Vlow1 830, which is applied to the gate of RP 832, and Vlow2 834, which is applied to the gate of RP 836, sets lower limit voltage 806. Signal 742 will be clipped if it drops low enough to forward bias D 808.

Common Mode Voltage Controllable Differential OTA

Figure 9:
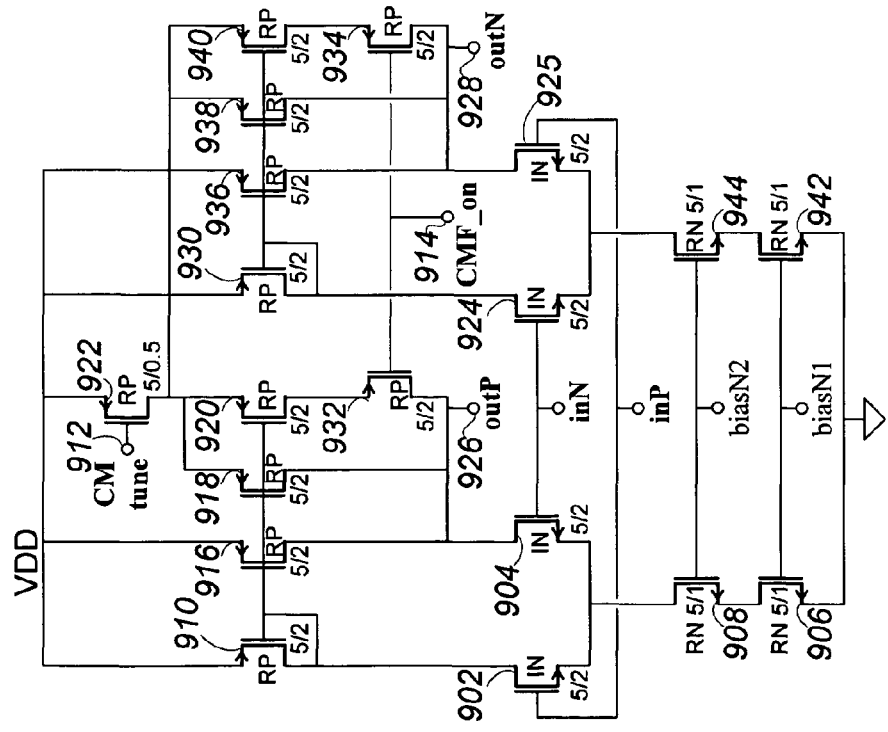
FIG. 9 schematically illustrates schematically represents a differential output operational transconductance amplifier having two differential pair amplifier circuits that each include variable ratio current mirror circuit controlled by a same ratio control input voltage.

FIG. 9 schematically illustrates exemplary details of the differential CM_OTA 710 of FIG. 7. The current for the positive differential input pair FETs 902 and 904 is set by RN 906 in conjunction with cascode RN 908 to less than 2 μA. FET 902 establishes current for current mirror sensing device RP 910. The current mirror causes the current provided to the drain of FET 904 to substantially reflect the current conducted by RP 910. However, a ratio between the current conducted through RP 910 (the sensed current) and the current delivered to the output at the drain of FET 904 (the mirrored current) may be continuously controlled by a voltage provided to a common mode control input CM_tune 912. Presuming that normal common mode feedback is enabled by CMF_on 914 being held low, the fixed reflection ratio of about 1/2 provided by RP 916 may be augmented by additional reflective conduction in RPs 918 and 920. If CM_tune 912 is high enough to turn RP 922 completely off, RP 916 is half the size and thus reflects about half the current sensed in (conducted by) RP 910, for a current mirror ratio of 2:1. However, if CM_tune 912 is quite low, then RPs 916, 918 and 920 reflect the current of RP 910 increased by a current mirror ratio of 1:2, because the total area of RPs 916, 918 and 920 is twice the area of RP 910. As CM_tune 912 is decreased, RPs 918 and 920 reflect a progressively larger multiple of the current of sensing device RP 910. Thus, CM_tune can control the effective current mirror ratio for differential input pair 902 and 904 over a range from about 1:2 to about 2:1.

Figure 11:
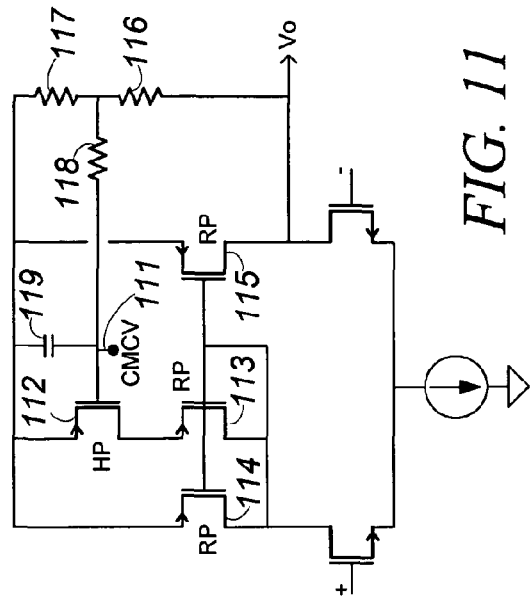
FIG. 11 is a simplified diagram demonstrating an alternative implementation of a variable ratio current mirror circuit.

A differential amplifier circuit within an OTA (OTA-diff amp) is a circuit having inputs to each of an input differential pair of transistors (such as 902 and 904) that are connected in common-emitter or common-source configuration. The common source is coupled to a circuit behaving roughly like a current source (e.g., properly biased RNs 906 and 908). Such an OTA-diff amp has two branches, one coupled to the drain or collector of each of the input differential pair devices. It is typical for one of the branches to conduct current through a current sensing element for a current mirror, as for example RP 910, and for the other branch to receive "mirrored" current from a "mirroring" circuit that reflects the current conducted by the sensing element, such as by having a comparable device biased to a gate voltage developed by the sensing device. Typically the mirroring circuit is a single device that closely matches the sensing device and thus sets a mirror ratio of about 1:1. In circuits that are designated "variable ratio current mirror OTA-diff amps," however, the effective ratio between the sensed and mirrored current is not only not necessarily 1:1, it is made continuously variable on the basis of a control input. One way to achieve that is to control an effective size of the mirroring circuit as compared to the sensing circuit. In FIG. 9, for example, devices 916, 918 and 920 may all be part of the mirroring circuit (if RP 932 is biased on). However, the drain voltage of RP 922 will affect an effective contribution to such mirroring circuit by RPs 918 and 920; thus, controlling the drain voltage of RP 922 is capable of continuously controlling the effective current mirror ratio. An alternative method for varying the current mirror ratio is to use a simple mirroring circuit, such as a single FET, in one branch, but to controllably parallel or shunt the current sensing circuit in the other branch, either changing the effective size of the sensing circuit, or else changing the proportion of branch current that is conducted, and thus sensed, by a sensing device. This alternative is illustrated in FIG. 11.

Thus, a variable ratio current mirror OTA-diff amp includes an additional variable ratio current mirror input node, a signal applied to which substantially controls a ratio between current sensed in one branch of the differential input pair transistors, and mirrored current in the other branch that reflects the sensed current. The variable ratio current mirror input in such an OTA-diff amp may be used, for example, to affect a gain of the OTA-diff amp, or for controlling an output voltage level taken from one of the branches. The circuit of FIG. 9, for example, employs two different variable ratio current mirror OTA-diff amps to control a common-mode voltage of differential outputs.

In FIG. 9, the gates of FET 902 and FET 904 are the plus (in P) and inverting (MN) inputs, respectively, for the first differential input pair. The gates of FETs 925 and 924 are the plus and inverting inputs, respectively, for a second differential input pair. A noninverting output (outP) 926 of the CM_OTA is at the drain of FET 904 of the first input differential pair, while an inverting output (outN) 928 is at the drain of FET 925 of the second input differential pair. RP 930 senses current for the current mirror of the second differential amplifier circuit.

RP 932 and RP 934, when turned off by a high voltage on CMF_on input 914, serve in both differential pair circuits to prevent current through the largest of the mirroring FETs in both differential circuits (RPs 920 and 940). In the second differential pair circuit, RPs 936, 938 and 940 serve the same purpose as is served by RPs 916, 918 and 920 in the first differential pair circuit. RNs 942 and 944 in the second differential pair circuit also function the same as RNs 906 and 908 of the first differential pair circuit. In the exemplary embodiment, RPs 916 and 918, as well as 936 and 938, are each half the effective size of the corresponding current setting FETs, RPs 910 and 930, respectively. RPs 920 and 940 are equal in size to RPs 910 and 930. Accordingly, if RPs 932 and 934 are turned off but RP 922 is fully turned on, then each current mirror is fixed at a ratio of approximately 1:1. In the exemplary circuit, if CMF_on 914 is disabled (high), CM_tune can still have some effect on the current mirror ratio, and should be pulled fully low to fix the current mirror ratios to about 1:1.

The variable current mirror ratio is controlled for both differential input pairs by RP 922. The current in the non-output branch of each differential circuit (RPs 910 and 930) are fixed current sensors for the respective current mirrors, while the outputs 926 and 928 are connected to the selectable FETs 918 and 920, and the selectable FETs 938 and 940, respectively. Accordingly, increasing the conduction of RP 922 raises a voltage level of both outputs: outP 926 and outN 928, raising the common mode output voltage. The converse occurs when the conduction of RP 922 is decreased; thus, RP 922 controls the common mode output voltage of the differential output CM_OTA of FIG. 9.

Referring again to the common mode control loop 50 of FIG. 7, the common mode voltage of CM_OTA 710 is the midpoint between the average voltages of the differential outputs 716 and 718. Because the positive output 716 is coupled to the inverting connection of the amplifier 760, CM_tune 720 will change inversely to positive output 716, so the output common mode voltage will follow the positive output 716. The common mode voltage is driven to equal the dc level of positive output 716, which occurs when the dc level of the inverting output 718 is equal to the dc level of the positive output 716. Because these two conditions are equivalent, it can be accomplished by merely driving the common mode voltage until inverting output 718 has the same average voltage as positive output 716. Because the common mode control loop 50 causes the positive output 716 to rise further, for a signal that causes it to rise initially, the loop increases the gain of the CM_OTA 710, particularly at lower frequencies. As a result, the CM_OTA 710 is able to function like an integrator, having extremely large gain for low frequency input offsets.

Figure 10:
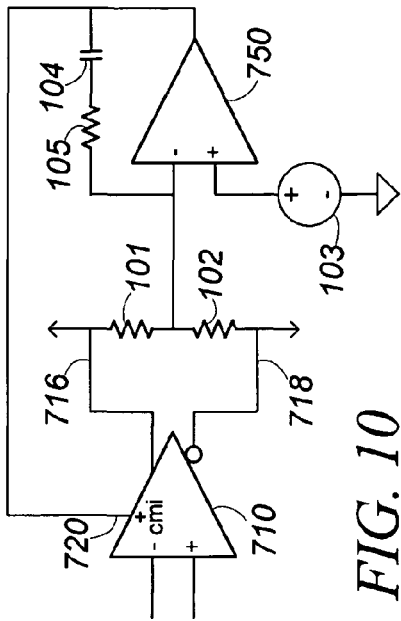
FIG. 10 is a simplified diagram demonstrating an alternative use for a common mode tunable operational transconductance amplifier.

Variable ratio current mirror OTA-diff amps are employed in the CM_OTA 710 to increase gain in the amplifier, particularly at lower frequencies. However, a CM_OTA can be employed to set the differential output common mode level to any desired level, as illustrated in FIG. 10. A differential CM_OTA 710, as in FIG. 7, has positive and inverting outputs 716 and 718. The common mode output voltage, established by Rs 101 and 102, may be compared to an arbitrarily selected voltage 103 (typically an output range midpoint) by a single ended OTA 750, configured as an integrator by C 104 with optional high frequency gain setting resistor R 105. Many other configurations are possible.

FIG. 11 schematically illustrates an alternative configuration of a variable current mirror in a differential amplifier circuit. In FIG. 11 a common mode control voltage CMCV 111 has an opposite polarity as does CM_tune of FIG. 9, because the output common mode voltage will tend to follow CMCV 111, whereas it tends in the opposite direction of CM_tune. HP 112 controls an effective "size" of the combination of RPs 113 and 114, which is one way to vary the mirror ratio. It is also possible for RP 113 to simply siphon current around the bias setting FET RP 114, such that the mirrored current from RP 115 will reflect only a portion of current in the "+" branch of the diff amp. Depending upon the application, the RP 113 may, for example, be three times the size of RP 114, while mirroring FET RP 115 may be twice the size of RP 114. An "enable" input may be added, and the ratio made fixable at 1:1, in the manner analogous to circuitry performing those functions in FIG. 9.

The variable ratio current mirror circuit of FIG. 11, as described above, may be used to replace the corresponding mirror components in a differential CM_OTA such as illustrated in FIG. 9. However, because of the sense inversion of the CMCV input, if such a CM_OTA is employed as illustrated in FIG. 7, the polarity of the amplifier 760 will also be inverted.

FIG. 11 illustrates a simplified circuit, suitable for processes having modestly sized high value resistances, by means of which gain can be boosted for a single differential amplifier having a variable ratio current mirror. Resistors 116 and 117 set a range for CMCV 111 as a function of Vo, while they operate with R 118 and C 119 to roll off gain at high frequency as necessary for stability. Replacing HP 112 by a higher threshold, lower gain THP FET may permit shorting R 116 and opening R 117 to reduce size requirements at the expense of gain. In many semiconductor processes it may be more practical to replace any or all of the components C 119 and Rs 116, 117 and 118 with active components, and thereby to produce similar or better results.

Single ended differential amplifiers having a variable ratio current mirror controlled by an input voltage may be suitable for many other purposes. For example, they may be used to nullify the effects of input misalignment or voltage offsets. They may also be employed as a third input to independently modulate a signal amplified by the differential amplifier circuit. The polarity of such an input may be selected by using a variable ratio current mirror as in FIG. 9 or as in FIG. 11.

Low Noise Differential Charge Pump Clock

A sinusoidal (or sine-like) charge pump clock signal is very useful for controlling a charge pump without generating spurs and undesirable harmonic noise. However, there are some drawbacks to employing sinusoidal clock signals to drive switching devices: available clock output amplitude is difficult to employ to achieve ample drive levels, because if switching occurs near the waveform midpoint, then only approximately half of the peak-to-peak waveform amplitude is available for driving a control node into its conduction voltage range. Employing a plurality of clock phases can simplify some charge pump design considerations, but will typically entail a need to accurately control the timing and/or amplitude relationships between the different clock output phases.

In general, making the clock outputs more sinusoidal reduces the amount of undesirable electrical noise that is generated. While perfect sine wave outputs are not possible, a waveform quality should be selected that provides adequate performance for the intended use of the circuit. The clock outputs may be required substantially sine-like, but a designer can almost arbitrarily select how sine-like to make the outputs; each improvement will result in a reduction of electrical noise at some nodes or locations, but each improvement may incur an added cost, such as in design effort and integrated circuit area usage.

Various parameters may be employed to define a clock waveform that is suitable to solve a particular noise problem created by bias generation, or other supply voltage generation, within an integrated circuit. A parameter of total harmonic distortion of a clock output compared to a perfect sine wave at the operating frequency fo is defined as the sum of the power in all harmonics of fo contained in the waveform, divided by the power in the fundamental frequency fo. Using that definition, in different embodiments the waveform may usefully be limited to having a THD of no more than −5 dB, −10 dB, −20 dB, or −30 dB. In some applications the third harmonic may be of particular interest, and different embodiments may require the third harmonic power to be no more than −20 dB, −30 dB, −40 dB or even −50 dB with respect to the fundamental power at fo. Also, it may be useful to control the clock waveform such that the amplitude of each harmonic of the fundamental frequency is rolled off by at least 20, 30 or 40 dB/decade. Thus, for a waveform having a fundamental operating frequency fo of 8 MHz and an amplitude $A_1$ for its 8 MHz sinusoidal wave component, the amplitude $A_N$ of every harmonic sinusoidal component at frequency N*fo, N an integer, may be required to be no greater than $A_1$ reduced by 20, 30 or 40 dB/decade. That is, using dB or dBA units for each quantity, the harmonic amplitudes may need to be limited such that $[A_N \leq A_1 - 2*N]$, or $[A_N \leq A_1 - 3*N]$, or $[A_N \leq A_1 - 4*N]$. Expanding the last for clarity: $[A_N (dBA) \leq A_1 (dBA) - 4*N (dBA)]$. Alternatively, the amplitudes of the harmonic components may be limited as follows (in volts): $[A_N \leq A_1/N/m]$, where depending upon circumstances m may need to be equal to 0.7, 1, 1.5, 2, 2.5, 3, 4 or 6. Which of these varying quality levels is required for the clock waveform will typically depend upon the problem, based on a particular hardware implementation in combination with desired emission limits, which the embodiments described herein are employed to solve.

Capacitive coupling of clock signals to control switching devices, which are necessarily disposed at many different potentials within a charge pump circuit, is sufficiently convenient to justify the relatively large semiconductor area required for adequate capacitors. However, capacitive coupling of a sinusoidal signal generally entails driving a switching device on with only half of the overall clock waveform (generally either the positive or negative half cycle of a clock signal). Accordingly, when supply voltages are small, it is not easy to provide sufficient drive voltage to the charge pump switching devices. Therefore, it will be helpful to provide charge pump clock signals that not only have two inverse sine-like phases, but that also have a peak-to-peak amplitude nearly equal to the available supply voltage.

Some exemplary embodiments of a low-noise charge pump clock employ differential inverter stages. The differential stages may be designed to ensure large amplitude signals that extend very nearly to the supply rails, and of course provide complementary outputs. Low noise operation is facilitated by current limiting each inverter in each stage. A substantially sine-like output, or any output having very low harmonic content beyond the operating frequency fo, may more readily be generated by employing less than five inverter stages in a ring oscillator. A differential ring oscillator has the advantage of permitting ring oscillators to have any number of stages, including both odd and even numbers, contrary to ordinary ring oscillator teaching. Some embodiments of the low noise charge pump clock may include a differential ring oscillator having two, three or four inverter stages.

A differential ring oscillator having an odd number of inverter stages will oscillate unconditionally, but it is possible for the two inverters in an inverter stage to have a common-mode output: the same, rather than an opposite, voltage at each moment on the two outputs. Differential ring oscillators having an odd number of stages, such as three, may therefore benefit from a method of ensuring that the two inverters of each inverter stage are in opposite phase. Such phase-separating circuitry in a single inverter stage may be sufficient, but phase control circuitry in other stages may also be helpful.

Figures 12A, 12B, 13:
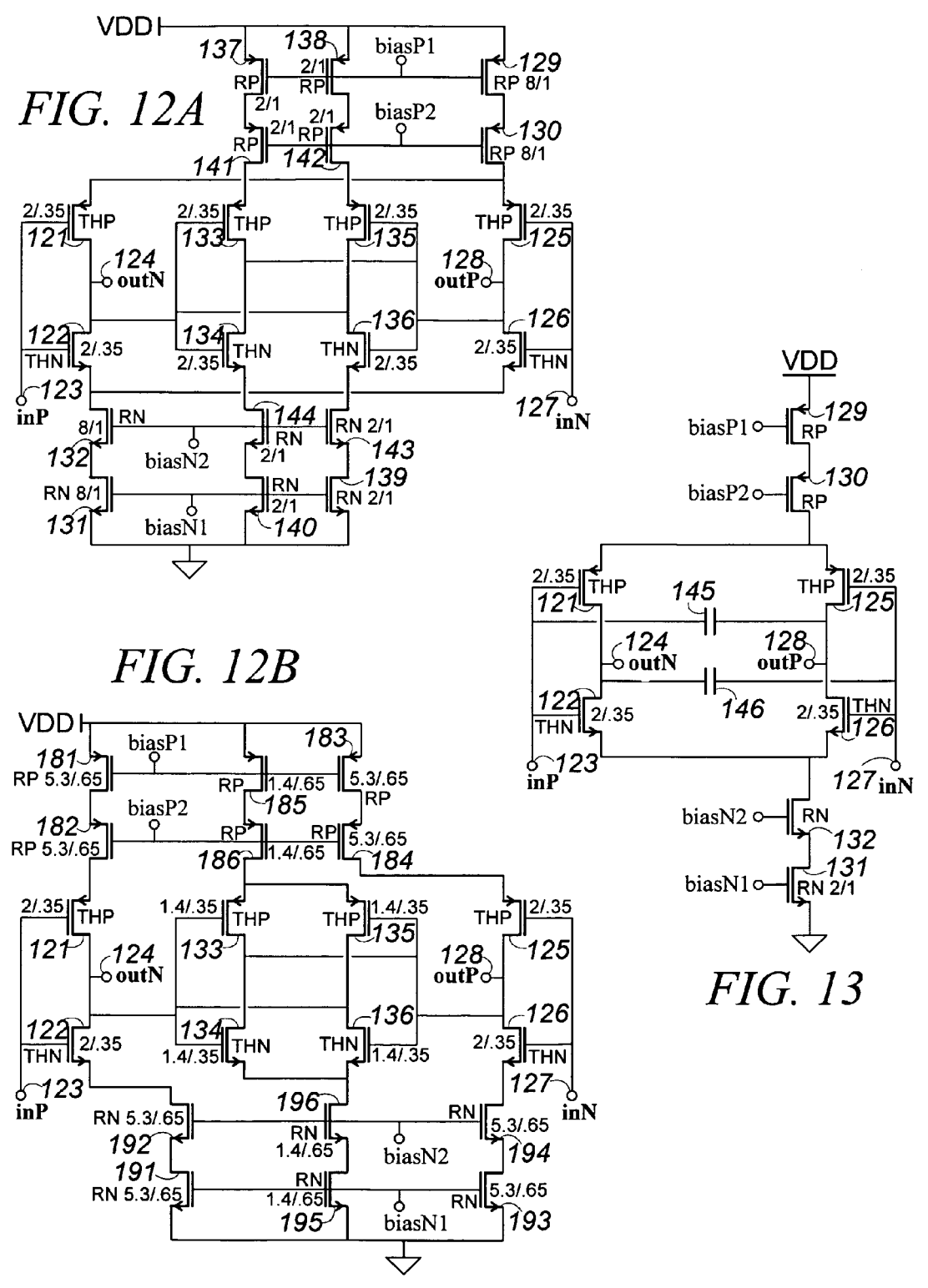

An exemplary design of a differential inverter stage that includes an anti-parallel inverter lock circuit is illustrated in FIG. 12A. THP 121 and THN 122 form a basic inverter of the positive input in P 123 to the positive inverted output outN 124, while THP 125 and THN 126 are configured as a complementary inverter from the inverted (or negative) input in N 127 to the inverted (and thus now positive) output outP 128. To limit the drive capacity of the inverters, and thus to slow and smooth the output transitions, both inverters are coupled to VDD via a current limiting circuit comprised of RPs 129 and 130, and are coupled to GND via a current limiting circuit comprised of RNs 131 and 132. RP 129 and RN 131 set the current based on bias voltages biasp1 and biasn1, respectively, while RP 130 and RN 132 are configured in cascode connection, biased by biasp2 and biasn2 respectively, to limit the current source sensitivity to output voltage. Because current setting FET RP 129 operates at nearly zero drain voltage irrespective of the voltage on the drain of RP 130, this cascode configured current source is capable of providing current even when the drain voltage of RP 130 is nearly VDD. Similarly, cascode configured RNs 131 and 132 are capable of providing correct current over all output voltages on the drain of RN 132 to within a few mV of ground. Thus, the output waveform may be tuned to achieve a p-p voltage nearly equal to the supply voltage VDD with respect to ground. These FETs 121-122, 125-126, and 129-132 constitute a complete basic differential inverter stage having both positive and inverted inputs 123 and 127 and positive and inverted outputs 124 and 128.

The remaining circuitry of FIG. 12A constitutes anti-parallel coupling that may be incorporated in one or more inverter stages of a differential oscillator having an odd number of stages. It is possible for the positive and inverted sections of a differential ring oscillator with an odd number of stages to operate at any phase relationship with respect to each other, so some provision is needed to ensure their phases are separated by 180 degrees. A first inverter comprised of THP 133 and THN 134 is cross-coupled with a second inverter comprised of THP 135 and THN 136. These FETs 133-136 may be made smaller, for example 70% as large, compared to the FETs 121-122 and 125-126 of the primary inverters of the stage. More importantly, the current sources that couple these anti-parallel inverters to VDD and GND may be designed for far less current than is provided to the primary inverter sections. In the exemplary embodiment, the separate current sources for the anti-parallel inverters are each configured to provide current levels one fourth that of the primary inverter current sources. RPs 137 and 138, and RNs 139 and 140, set the current levels at about one fourth that of RP 129 and RN 131, respectively, while RPs 141 and 142, and RNs 143 and 144, are cascode configured to control the drain voltage of the current setting devices. If the primary inverters are oscillating in tandem, they must share current from current sources 129-130 and 132-132, but even then have twice the current available as the anti-parallel inverter current sources. When the primary inverters are oscillating properly in opposing phase, the two inverter sections of the stage do not concurrently use the same current source.

FIG. 12B is an alternative implementation of a differential inverter stage that includes an anti-parallel inverter lock circuit. It differs from FIG. 12A primarily in the manner of current limiting the inverter stages. In FIG. 12A a single current source through FETs 129-130 supplies the source current for both primary inverters to the sources of FETs 121 and 125, while another single current source through FETs 131-132 supplies the sink current for both primary inverters to the sources of FETs 122 and 126. Separate current sources provide source and sink current for the two phase opposition locking inverters of FETs 133-134 and 135-136. In FIG. 12B, by contrast, one single current source consisting of FETs 185-186 provides source current, and another single current source consisting of FETs 195-196 provides sink current, for both phase opposition locking inverters comprising FETs 133-134 and 135-136. Conversely, the separate current sources of FETs 181-182 and 183-184 provide source current for the two primary inverters to FETs 121 and 125, respectively; similarly, the separate current sources of FETs 191-192 and 193-194 provide sink current for the two primary inverters to FETs 122 and 126, respectively.

The sizes of the inverters and associated current source transistors also differs between FIG. 12B and FIG. 12A. The width and length of the channel is indicated in the figures by the numbers separated by a forward slash, indicating width/length, in microns. RP and RN FETs have threshold voltages Vth of about 0.65 V and 0.7 V, respectively, while Vth for THP and THN FETs are about 0.95 V and 1.0 V. These are merely guides; the size of the devices depends heavily on the particular fabrication process, as well as on the loading and other performance factors of the oscillator. Also, although only two current limit schemes are set forth in FIGS. 12A and 12B, embodiments of such a differential oscillator stage may employ many different current sourcing and anti-parallel phase opposition lock configurations without deviating from the essential ideas set forth herein, and without exceeding the scope of claims set forth herein. FIG. 13 illustrates an exemplary alternative means to provide phase opposition locking.

FIG. 13 illustrates a differential inverter stage that does not include anti-parallel locking inverters, but instead illustrates an alternative whereby capacitances may be cross coupled to ensure that the differential stages are 180 degrees out of phase. The basic inverter stage consists of the same numbered FETs, inputs and outputs 121-132 as illustrated in FIG. 12A. Capacitor 145 couples output outP 128 to input in P 123, while capacitor 146 couples output outN 124 to input in N 127. The inverter pairs in a differential ring oscillator will have little tendency to synchronize in matching phase, and have some tendency to synchronize in opposite phase because they then have access to the full current of a current source (FETs 129-130 or 131-132). It is for this reason that the anti-parallel inverters of FIG. 12A require little current capacity. For the same reason, modest capacitance of about 200 fF is adequate to ensure phase-opposite synchronization of the inverters of the inverter stage of FIG. 13. FIGS. 12 and 13 illustrate two out of many possible alternatives for ensuring phase opposition between the outputs of a differential inverter stage. However, in some semiconductor fabrication processes, active anti-parallel inverter circuitry such as illustrated in FIG. 12A may require less semiconductor area than the capacitors shown for the same purpose in FIG. 13.

Because they may function substantially identically to the primary inverters of FIGS. 12A and 12B, the inverters of FIG. 13 are indicated by identical reference designators. They consist of FET pairs 121, 122 (producing outN 124 from in P 123) and 125, 126 (producing outP 128 from in N 127). In FIG. 13 these two inverters shares a single source current source (FETs 129, 130) and a single sink current source (FETs 131, 132), identically as in FIG. 12A. In some circumstances it may be more suitable to provide separate current source circuits for each of the inverters of FIG. 13 in the manner illustrated in FIG. 12B. As illustrated there, source and sink current may be provided to the in P to outN inverter via FET pairs 181, 182 and 191, 192, respectively, and to the in N to outP inverter via different FET pairs 183, 184 and 193, 194, respectively.

Ring oscillators having an even number of inverter stages expand the design flexibility for ring oscillators, providing an additional parameter to help control the operating frequency range. This is particularly useful for embodiments required to include less than five inverter stages in order to produce a better output, because it triples the number of alternatives satisfying that requirement. An even number of inverter stages may be employed by cross coupling the positive and negative outputs of one stage to the negative and positive inputs, respectively, of the next stage. Because such cross coupling ensures that the outputs of each stage will be correctly out of phase, no inverter stage needs phase separating circuitry such as is illustrated in FIGS. 12 and 13. However, a ring oscillator having an even number of stages does not unconditionally oscillate, so a provision for proper startup may be required.

Figure 14:
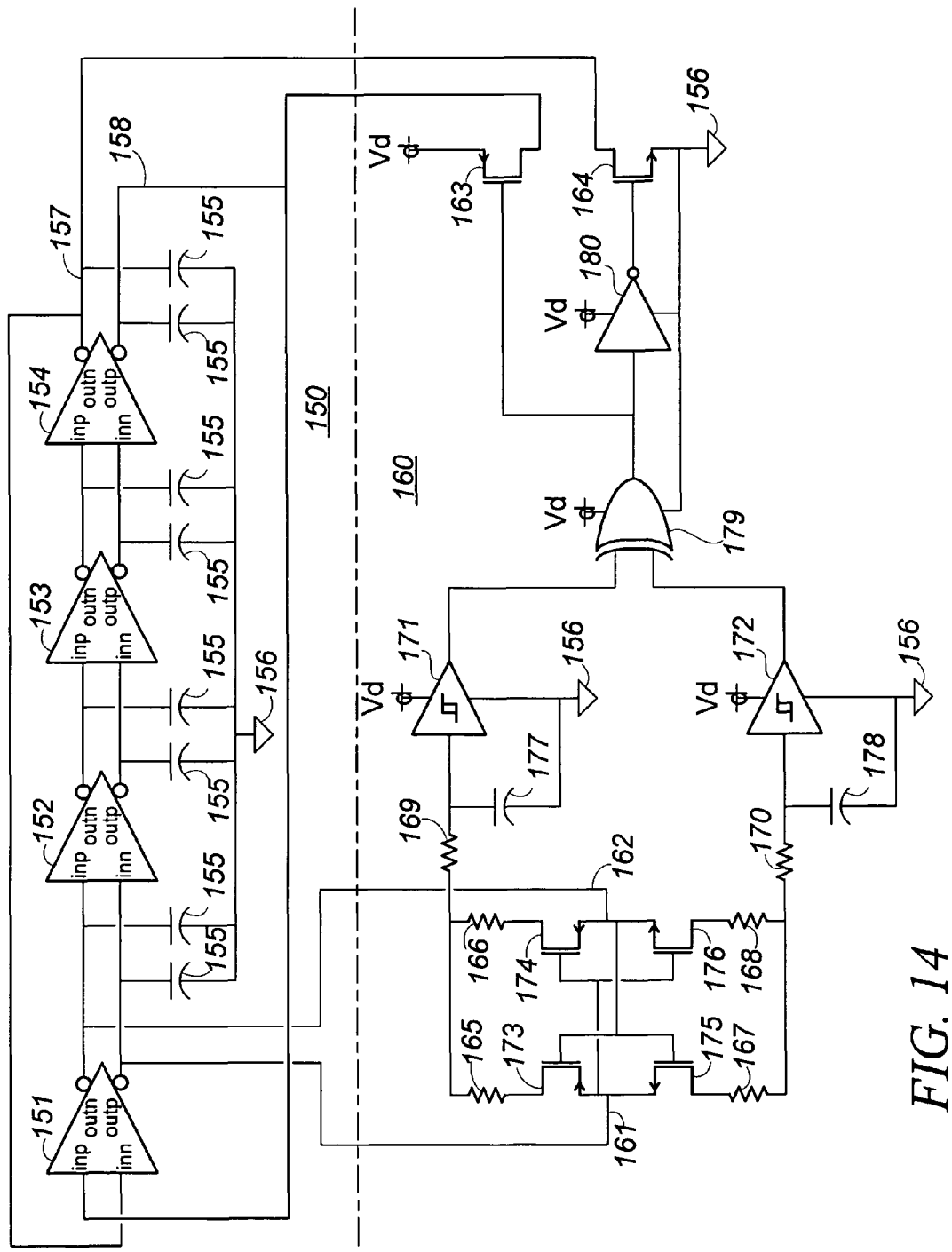
FIG. 14 is a simplified diagram representing features of a four-stage ring oscillator coupled to a startup circuit.

FIG. 14 schematically illustrates a four stage differential ring oscillator 150 coupled to a startup circuit 160. The four differential inverter stages 151-154 may each be configured as illustrated in FIG. 13, except capacitors 145 and 146 are unnecessary. A capacitor 155 is disposed between each differential inverter output and ground 156. Because the drive current of each inverter stage is constrained by current limiting circuits for both source (RPs 129 and 130 in FIG. 13) and sink (RNs 131 and 132 in FIG. 13) currents, these capacitors 155 are able to smooth and shape the output to produce a substantially sine-like waveform that is smooth and free of spurs and unwanted harmonic content, as described elsewhere herein.

Each of the outputs outN (124 in FIG. 13) of differential inverter stages 151-153 is coupled to the input in P (123 in FIG. 13) of the subsequent stage. However, outN 157 of differential inverter 154 is cross coupled to in N (127 in FIG. 13) of differential inverter stage 151. Similarly, each of the outputs outP (128 in FIG. 13) of differential stages 151-153 is coupled to in N of the subsequent stage, except for outP 158 of inverter stage 154, which is cross coupled to in P of inverter stage 151.

The remainder of FIG. 14 schematically represents an example of a startup circuit 160 to ensure oscillation by differential ring oscillator 150. The inputs 161 and 162 to the startup circuit 160 may be coupled to the two outputs of any of the inverter stages 151-154. Although the outputs of the startup circuit 160, at the drains of FETs 163 and 164, are connected to outputs outP 158 and outN 157 of differential inverter stage 154, they could be connected instead, for example, to the outputs of the differential inverter stage 151, as are the inputs 161 and 162 of the startup circuit 160.

The startup circuit 160 is intended to identify a stable common mode condition in which both outputs of an inverter stages are stable, when either both are low, or both are high. Upon sensing that condition, startup circuit 160 will force the two outputs of each inverter stage into opposite polarities (differential mode). Resistors 165-170 may all be nominally around 2 MΩ or more, because the FET inputs to Schmitt triggers 171 and 172 draw practically no current. The large impedance of resistors 165-170, in conjunction with FETs 173-176, cooperate with capacitors 177 and 178 to increase noise immunity at the inputs of Schmitt trigger devices 171 and 172.

In a first common mode condition both inputs 161 and 162 are low, biasing "on" the P-FETs 173 and 174 to gradually draw Schmitt trigger 171 at least within a threshold voltage of the extremely low input voltages. While N-FETs 175 and 176 are biased off, the sources are at the very low input voltages, and thus any positive charge on C 178 will be drawn off by their combined channel leakage current, which will greatly exceed any positive leakage from the FET input of Schmitt trigger 172. In a second common mode condition both inputs 161 and 162 are high, biasing "on" the N-FETs 175 and 176 to slowly raise the input of Schmitt trigger 172 by conduction via Rs 167, 168 and 170. Conduction to raise the voltage if Schmitt trigger 171 is limited to leakage through off-biased P-FETs 173 and 174. Though the channel leakage is tiny, it will exceed leakage to ground through the insulated-gate FET Schmitt trigger input and through C 177. In the exemplary process, nearly all low voltage capacitors to ground are fabricated as capacitor-connected depletion-type N (DN) FETs having negligible leakage current. Thus, in both common mode conditions, the two Schmitt triggers will eventually arrive at a common output voltage. Such same-polarity inputs will produce a low output from exclusive-or gate 179, directly biasing on the first starter circuit output P-FET 163, and causing inverter 180 to bias on the second starter circuit output N-FET 164. The activated FETs 163 and 164 easily drive the outputs 158 and 157 of differential inverter stage 154 to opposite supply rails because of the very limited current drive capacity of the inverter outputs.

All inverter stage output pairs will have a stable and opposite polarity as long as output FETs 163 and 164 remain fully driven, including the output pair of inverter stage 151 that is coupled to inputs 161 and 162 of startup circuit 160. Opposite (differential) polarity on the inputs 161 and 162 will eventually cause the two Schmitt triggers to establish opposite states, resulting in the release of the startup circuit output drive such that oscillation of the ring will commence. In a first differential alternative input 161 is low and 162 is high, so PFET 173 is off and the enabled P-FET 174 can provide sufficient current from input 162 to charge C 177 via Rs 166 and 169, eventually developing a high on the input to Schmitt trigger 171. Concurrently, N-FET 176 will be off so that the forward biased N-FET 175 will gradually draw the voltage of C 178 below the low threshold of Schmitt trigger 172 by conduction through R 167 and R 170. In the converse second differential alternative input 161 is high and input 162 is low. N-FET 175 is off so forward biased N-FET 176 can gradually establish a low on the input of Schmitt trigger 172. P-FET 174 is also off, permitting forward biased P-FET 173 to raise the input of Schmitt trigger 171 toward the high input 161 voltage via Rs 165 and 169.

As is seen, both possible opposite-polarity input conditions drive the input of Schmitt trigger 171 toward high while driving the input of Schmitt trigger 172 toward low. Those Schmitt trigger conditions will be reinforced during every half cycle during proper oscillation. The input values approach each other only near the midpoint of the clock waveform, during which brief times the drive voltages are negligible.

CONCLUSION

The foregoing description illustrates exemplary implementations, and novel features, of circuits and method for generating bias and auxiliary supply voltages both quietly and efficiently. Many such voltages are generated by pumping charge via transfer capacitors without generating excessive electrical noise. Many features combine to produce the desired result, and are each described separately. Some features of apparatus and methods, which constitute the best mode of implementing quiet, efficient bias generation circuits and methods, are themselves novel and widely useful. Consequently, the description set forth above necessarily describes a variety of distinct innovations.

The skilled person will understand that various omissions, substitutions, and changes in the form and details of each of the methods and apparatus illustrated may be made without departing from the scope of such method or apparatus. Because it is impractical to list all embodiments explicitly, it should be understood that each practical combination of features set forth above (or conveyed by the figures) that is suitable for embodying one of the apparatus or methods constitutes a distinct alternative embodiment of such apparatus or method. Moreover, each practical combination of equivalents of such apparatus or method alternatives also constitutes an alternative embodiment of the subject apparatus or methods. Therefore, the scope of the presented methods and apparatus should be judged only by reference to the claims that are appended, as they may be amended during pendency of any application for patent. The scope is not limited by features illustrated in exemplary embodiments set forth herein for the purpose of illustrating inventive concepts, except insofar as such limitation is recited in an appended claim.

The circuits illustrated and described herein are only exemplary, and should be interpreted as equally describing such alternatives as may be reasonably seen to be analogous by a person of skill in the art, whether by present knowledge common to such skilled persons, or in the future in view of unforeseen but readily-applied alternatives then known to such skilled persons.

All variations coming within the meaning and range of equivalency of the various claim elements are embraced within the scope of the corresponding claim. Each claim set forth below is intended to encompass any system or method that differs only insubstantially from the literal language of such claim, but only if such system or method is not an embodiment of the prior art. To this end, each element described in each claim should be construed as broadly as possible, and should be understood to encompass any equivalent to such element insofar as possible but without also encompassing the prior art.

What is claimed is:

1. An integrated operational transconductance amplifier ("OTA") having a variable-ratio current mirror differential amplifier section comprising:
    a) a differential pair of FETs including a first transistor M1 having a source S1 coupled to a source S2 of a second transistor M2 and to a current source Ics, the two forming a differential input pair of FETs for the OTA, the corresponding drains of the input pair forming a pair of differential current branches;
    b) an output voltage connection Vout+ coupled to one of the differential current branches;
    c) a variable ratio current mirror circuit, including
        i) a current sensing circuit conducting a first current through one of the differential current branches; and
        ii) a current mirror reflection circuit that generates a second current substantially reflective of the first current, in the other differential current branch, the current mirror reflection circuit comprising a third transistor arranged to operate in parallel with a fourth transistor; and
    d) a current mirror ratio control circuit comprising a first control FET coupled in series with the fourth transistor of the current mirror reflection circuit, the first control FET including a gate configured as a mirror ratio control node to which is applied a voltage that is continuously variable for varying a ratio between the first current conducted through the current sensing circuit and the second current conducted through the current mirror reflection circuit.

2. The OTA of claim 1, wherein the ratio is variable between 1:K and K:1 (K>1), and wherein the current mirror reflection circuit is a single FET and the current sensing circuit comprises at least one FET having drain and gate coupled together.

3. The OTA of claim 1, wherein the current sensing circuit is a single FET and the current mirror reflection circuit comprises a plurality of FETs, and wherein the first control FET is coupled to sources of the plurality of current mirror reflection circuit FETs.

4. The OTA of claim 1, wherein the variable-ratio current mirror differential amplifier section is a first such section, further comprising a second variable-ratio current mirror differential amplifier section according to elements (a)-(d), the first and second amplifier sections having common inputs coupled to opposite differential inputs to produce inverting and noninverting outputs, wherein the two variable-ratio current mirrors are controlled by the same mirror ratio control node.

5. The OTA of claim 4, further comprising a circuit that couples the continuously variable voltage that is generated at an output of the OTA to the mirror ratio control node.

6. The OTA of claim 4, further comprising a separate amplification circuit that generates the voltage that is continuously variable based on a difference between the inverting and noninverting outputs.

7. The OTA of claim 1, wherein the current mirror reflection circuit comprises three FETs coupled substantially in parallel, one of the parallel FETs having a source coupled to the first control FET.

8. An integrated operational transconductance amplifier ("OTA") having a variable-ratio current mirror differential amplifier section comprising:
   a) a differential pair of FETs including a transistor M1 having a source S1 coupled to a source S2 of a second transistor M2 and to an approximate current source Ics, the two forming a differential input pair of FETs for the OTA, the corresponding drains of the input pair forming a pair of differential current branches;
   b) an output voltage connection Vout+ coupled to one of the differential current branches; and
   c) a variable ratio current mirror circuit, including
      i) a current sensing circuit that is a single FET, the current sensing circuit conducting current from one of the differential current branches that generates a current control voltage reflective of the quantity of current thus conducted;
      ii) a current mirror reflection circuit that generates a current substantially reflective of the current control voltage in the other differential current branch, the current mirror reflection circuit comprising a plurality of FETs having drain and gate coupled together; and
      iii) a circuit, proportionally controllable by a signal applied to a mirror ratio control node that controls a control FET coupled between sources of the plurality of FETs of the mirror reflection circuit within the OTA, which aids either (A) conducting current of the current sensing circuit, or (B) producing current reflective of the current control voltage, such that
   d) a ratio between current conducted by the current sensing circuit and the current mirror reflection circuit is continuously variable over a range under control of the signal applied to the mirror ratio control node.

9. An integrated operational transconductance amplifier ("OTA") comprising:
a first variable-ratio current mirror differential amplifier section, comprising:
   a) a differential pair of FETs including a transistor M1 having a source S1 coupled to a source S2 of a second transistor M2 and to an approximate current source Ics, the two forming a differential input pair of FETs for the OTA, the corresponding drains of the input pair forming a pair of differential current branches,
   b) an output voltage connection Vout+ coupled to one of the differential current branches;
   c) a variable ratio current mirror circuit, including
      i) a current sensing circuit conducting current from one of the differential current branches that generates a current control voltage reflective of the quantity of current thus conducted;
      ii) a current mirror reflection circuit that generates a current substantially reflective of the current control voltage in the other differential current branch; and
      iii) a circuit, proportionally controllable by a signal applied to a mirror ratio control node within the OTA, which aids either (A) conducting current of the current sensing circuit, or (B) producing current reflective of the current control voltage, such that
   d) a ratio between current conducted by the current sensing circuit and the current mirror reflection circuit is continuously variable over a range under control of the signal applied to the mirror ratio control node; and
a second variable-ratio current mirror differential amplifier section according to elements (a)-(d), the first and second amplifier sections having common inputs coupled to opposite differential input devices to produce two outputs inverse from each other, wherein the two variable-ratio current mirror circuits are controlled by the same mirror ratio control node.

10. The OTA of claim 9, further comprising a circuit that couples a signal substantially based on an output of the OTA to the mirror ratio control node.

11. The OTA of claim 9, further comprising a separate amplification circuit that couples a signal based on a difference between the inverting and noninverting outputs to the mirror ratio control node.

12. An integrated operational transconductance amplifier ("OTA") having a variable-ratio current mirror differential amplifier section comprising:
   a) a differential pair of FETs including a transistor M1 having a source S1 coupled to a source S2 of a second transistor M2 and to an approximate current source Ics, the two forming a differential input pair of FETs for the OTA, the corresponding drains of the input pair forming a pair of differential current branches;
   b) an output voltage connection Vout+ coupled to one of the differential current branches; and
   c) a variable ratio current mirror circuit, including
      i) a current sensing circuit conducting current from one of the differential current branches that generates a current control voltage reflective of the quantity of current thus conducted;
      ii) a current mirror reflection circuit that generates a current substantially reflective of the current control voltage in the other differential current branch; and
      iii) a circuit comprising three FETs coupled substantially in parallel, one of the parallel FETs having a source coupled to a source of another via a first control FET, and one of the parallel FETs having a drain coupled via a second control FET to drains of the other two parallel FETs, the circuit proportionally controllable by a signal applied to a mirror ratio control node within the OTA, which aids either (A) conducting current of the current sensing circuit, or (B) producing current reflective of the current control voltage, such that
   d) a ratio between current conducted by the current sensing circuit and the current mirror reflection circuit is continuously variable over a range under control of the signal applied to the mirror ratio control node.

* * * * *